(12) United States Patent
Shibazaki et al.

(10) Patent No.: US 9,532,033 B2
(45) Date of Patent: Dec. 27, 2016

(54) IMAGE SENSOR AND IMAGING DEVICE

(75) Inventors: Kiyoshige Shibazaki, Higashimurayama (JP); Muneki Hamashima, Fukaya (JP); Susumu Mori, Tokyo (JP); Satoshi Suzuki, Tokyo (JP)

(73) Assignee: NIKON CORPORATION, Tokyo (JP)

( * ) Notice: Subject to any disclaimer, the term of this patent is extended or adjusted under 35 U.S.C. 154(b) by 562 days.

(21) Appl. No.: 13/305,272

(22) Filed: Nov. 28, 2011

(65) Prior Publication Data

US 2012/0140100 A1 Jun. 7, 2012

Related U.S. Application Data

(60) Provisional application No. 61/555,627, filed on Nov. 4, 2011.

(30) Foreign Application Priority Data

Nov. 29, 2010 (JP) ................................. 2010-265783
Nov. 29, 2010 (JP) ................................. 2010-265784
(Continued)

(51) Int. Cl.
*H04N 13/02* (2006.01)
*H01L 27/146* (2006.01)

(52) U.S. Cl.
CPC .... *H04N 13/0285* (2013.01); *H01L 27/14621* (2013.01); *H01L 27/14623* (2013.01);
(Continued)

(58) Field of Classification Search
USPC .................................................. 348/42–50
See application file for complete search history.

(56) References Cited

U.S. PATENT DOCUMENTS

| 4,410,804 A | 10/1983 | Stauffer |
| 2002/0122124 A1 | 9/2002 | Suda |

(Continued)

FOREIGN PATENT DOCUMENTS

| JP | A-8-47001 | 2/1996 |
| JP | A-2001-267544 | 9/2001 |

(Continued)

OTHER PUBLICATIONS

Dec. 27, 2011 International Search Report issued in International Application No. PCT/JP2011/006666 (with translation).
(Continued)

*Primary Examiner* — Roberto Velez
*Assistant Examiner* — Yih-Sien Kao
(74) *Attorney, Agent, or Firm* — Oliff PLC

(57) ABSTRACT

An image capturing element comprising photoelectric converting elements that are arranged two-dimensionally and photoelectrically convert incident light into an electric signal; aperture masks that correspond one-to-one with the photoelectric converting elements; and color filters that correspond one-to-one with the photoelectric converting elements. Among n adjacent photoelectric converting elements, where n is an integer no less than three, apertures of the aperture masks corresponding to at least three of the photoelectric converting elements are included within each pattern of a color filter pattern formed from at least two types of the color filters that respectively pass different wavelength bands, and are positioned to respectively pass light from different partial regions within a cross-sectional region of the incident light, and photoelectric converting element groups that are each formed of the n photoelectric converting elements are arranged in series.

42 Claims, 37 Drawing Sheets

(30) Foreign Application Priority Data

| Mar. 28, 2011 | (JP) | 2011-070405 |
| Mar. 28, 2011 | (JP) | 2011-070406 |
| Apr. 14, 2011 | (JP) | 2011-090233 |

(52) U.S. Cl.
CPC ... H01L 27/14629 (2013.01); H04N 13/0225 (2013.01); H04N 13/0257 (2013.01)

(56) References Cited

U.S. PATENT DOCUMENTS

| 2003/0206343 A1* | 11/2003 | Morishima et al. ........... 359/463 |
| 2006/0001765 A1 | 1/2006 | Suda |
| 2007/0145273 A1* | 6/2007 | Chang .......................... 250/338.1 |
| 2007/0252074 A1* | 11/2007 | Ng et al. ...................... 250/208.1 |
| 2009/0067828 A1 | 3/2009 | Ono et al. |
| 2009/0140122 A1* | 6/2009 | Suzuki ......................... 250/201.2 |
| 2009/0153693 A1 | 6/2009 | Onuki et al. |
| 2010/0091161 A1* | 4/2010 | Suzuki .......................... 348/302 |
| 2010/0238330 A1* | 9/2010 | Hirota ........................... 348/273 |
| 2010/0302432 A1* | 12/2010 | Komuro ........................ 348/340 |

FOREIGN PATENT DOCUMENTS

| JP | A-2002-204462 | 7/2002 |
| JP | A-2003-7994 | 1/2003 |
| JP | A-2005-64385 | 3/2005 |
| JP | A-2009-69255 | 4/2009 |
| JP | A-2009-86144 | 4/2009 |
| JP | A-2009-147665 | 7/2009 |
| JP | A-2009-217073 | 9/2009 |
| JP | A-2009-239493 | 10/2009 |
| JP | A-2010-68018 | 3/2010 |
| JP | A-2010-74218 | 4/2010 |
| JP | A-2010-147143 | 7/2010 |
| JP | 2010-220192 A | 9/2010 |
| JP | A-2011-199755 | 10/2011 |

OTHER PUBLICATIONS

International Preliminary Report on Patentability issued in International Patent Application No. PCT/JP2011/006666 dated Jun. 4, 2013.
European Search Report dated Jul. 2, 2014 from European Patent Application No. 11 845 487.5.
Sep. 29, 2015 Office Action issued in Japanese Patent Application No. 2012-546697.
Jan. 4, 2016 Office Action issued in Chinese Patent Application No. 20118005752.4.
Sep. 20, 2016 Office Action issued in Chinese Patent Application No. 201180057523.4.

\* cited by examiner

⟨1⟩ WHEN n = 2

| REPEATING PATTERN TYPE | | PRESENCE OF PARALLAX PIXELS | | | PARALLAX PIXELS | PARALLAX ARRANGEMENT | CHARACTERISTICS |
|---|---|---|---|---|---|---|---|
| | | Gr | Gb | R, B | | | |
| TYPE A | A-1 | YES | YES | NO | Gr AND Gb | Gr IN Gr ROW, Gb IN Gb ROW | IMAGE QUALITY OF 2D IMAGES MAINTAINED TO SOME EXTENT, 3D IMAGES CAN BE OBTAINED |
| | A-2 | | | | | Gr IN Gr COLUMN, Gb IN Gb COLUMN | |
| TYPE B | B-1 | YES (NO) | NO (YES) | NO | EITHER Gr ONLY OR Gb ONLY | Gr IN Gr ROW | 3D IMAGES CAN BE OBTAINED WITH THE SAME HIGH RESOLUTION AS 2D IMAGES |
| | B-2 | | | | | Gb IN Gb COLUMN (OR Gr IN Gr COLUMN) | |
| TYPE C | C-1 | YES | YES | NO | 2 PIXELS EACH OF Gr AND Gb | Gr IN Gr ROW, Gb IN Gb ROW | COLOR 3D IMAGES WITH RELATIVELY HIGH RESOLUTION AND 2D IMAGES WITH RELATIVELY LOW RESOLUTION CAN BE OBTAINED |
| | C-2 | | | | | Gr IN Gr COLUMN, Gb IN Gb COLUMN | |
| TYPE D | D-1 | YES | NO | YES | 3 PIXELS EACH OF Gr, R, AND B | Gr AND R IN Gr ROW, B IN Gb ROW | COLOR 3D IMAGES WITH SUFFICIENTLY HIGH QUALITY AND 2D IMAGE INFORMATION CAN BE OBTAINED |
| | D-2 | | | | | Rr IN Gr COLUMN, Gb AND B IN Gb COLUMN | |
| TYPE E | E-1 | YES | YES | YES | 4 PIXELS EACH OF Gr, Gb, R, AND B | Gr AND R IN Gr ROW, Gb AND B IN Gb ROW | RESOLUTION IS DECREASED, BUT COLOR 3D IMAGES WITH HIGHEST QUALITY CAN BE OBTAINED |
| | E-2 | | | | | R AND Gr IN Gr COLUMN, Gb AND B IN Gb COLUMN | |

FIG. 13

<2> WHEN n = 3

| REPEATING PATTERN TYPE | | PRESENCE OF PARALLAX PIXELS | | | PARALLAX PIXELS | PARALLAX ARRANGEMENT | CHARACTERISTICS |
|---|---|---|---|---|---|---|---|
| | | Gr | Gb | R, B | | | |
| TYPE A | At-1 | YES | YES | NO | Gr AND Gb | Gr IN Gr ROW, Gb IN Gb ROW | IMAGE QUALITY OF 2D IMAGES MAINTAINED TO SOME EXTENT, 3D IMAGES CAN BE OBTAINED |
| | At-2 | NO | NO | YES | R, G, AND B ARE PARALLAX | Gr IN Gr COLUMN, Gb IN Gb COLUMN R IN Gr ROW, B IN Gb ROW | PARALLAX FOR EACH COLOR INDEPENDENTLY, ANAGLYPH 3D AND HIGH-RESOLUTION 2D BLACK AND WHITE IMAGES OBTAINABLE |
| TYPE B | Bt-1 | | | | | Gr IN Gr ROW | 3D IMAGES CAN BE OBTAINED WITH THE SAME HIGH RESOLUTION AS 2D IMAGES |
| | Bt-2 | YES (NO) | NO (YES) | NO | EITHER Gr ONLY OR Gb ONLY | Gr IN Gr COLUMN | |
| | Bt-3 | | | | | Gr AND Gb ALTERNATELY IN Gr AND Gb ROWS | THE ABOVE CHARACTERISTICS, AND RESOLUTION CAN BE ALLOCATED VERTICALLY AND HORIZONTALLY |
| TYPE C | Ct-1 | YES | YES | NO | 2 PIXELS EACH OF Gr AND Gb | Gr IN Gr ROW, Gb IN Gb ROW | COLOR 3D IMAGES WITH RELATIVELY HIGH RESOLUTION AND 2D IMAGES WITH RELATIVELY LOW RESOLUTION CAN BE OBTAINED |
| | Ct-2 | | | | | Gr IN Gr COLUMN, Gb IN Gb COLUMN | |
| | Ct-3 | YES/NO | NO/YES | | | Gr IN Gr ROW, Gb IN Gb COLUMN | THE ABOVE CHARACTERISTICS, AND RESOLUTION CAN BE ALLOCATED VERTICALLY AND HORIZONTALLY |
| TYPE D | Dt-1 | YES | NO | YES | 3 PIXELS EACH OF Gr, R, AND B | Gr AND R IN Gr ROW, B IN Gb ROW | COLOR 3D IMAGES WITH SUFFICIENTLY HIGH QUALITY AND 2D IMAGE INFORMATION CAN BE OBTAINED |
| | Dt-2 | | | | | Rr IN Gr COLUMN, Gb AND B IN Gb COLUMN | |
| | Dt-3 | YES/NO | NO/YES | | | Gr AND R IN Gr ROW, Gb AND B IN Gb COLUMN | THE ABOVE CHARACTERISTICS, AND RESOLUTION CAN BE ALLOCATED VERTICALLY AND HORIZONTALLY |
| TYPE E | Et-1 | | | | | Gr AND R IN Gr ROW, B AND Gb IN Gb ROW | RESOLUTION IS DECREASED, BUT COLOR 3D IMAGES WITH HIGHEST QUALITY CAN BE OBTAINED |
| | Et-2 | YES | YES | YES | 4 PIXELS EACH OF Gr, Gb, R, AND B | R AND Gr IN Gr COLUMN, Gb AND B IN Gb COLUMN | |
| | Et-3 | | | | | Gr AND R IN Gr ROW, B AND Gb IN Gb ROW | THE ABOVE CHARACTERISTICS, AND RESOLUTION CAN BE ALLOCATED VERTICALLY AND HORIZONTALLY |

FIG. 18

⟨3⟩ WHEN n IS AN EVEN NUMBER ≥ 4

| REPEATING PATTERN TYPE | | PRESENCE OF PARALLAX PIXELS | | | PARALLAX PIXELS | PARALLAX LINE-UP DIRECTION (ARRANGEMENT) | CHARACTERISTICS |
|---|---|---|---|---|---|---|---|
| | | Gr | Gb | R, B | | | |
| TYPE A | Ae-1 | YES | YES | NO | Gr AND Gb | ODD-NUMBERED Gr IN Gr ROW, EVEN-NUMBERED Gb IN Gb ROW | IMAGE QUALITY OF 2D IMAGES MAINTAINED TO SOME EXTENT, 3D IMAGES CAN BE OBTAINED |
| | Ae-2 | | | | | EVEN-NUMBERED Gr IN Gr COLUMN, ODD-NUMBERED Gb IN Gb COLUMN | |

⟨4⟩ WHEN n IS AN ODD NUMBER ≥ 5

| REPEATING PATTERN TYPE | | PRESENCE OF PARALLAX PIXELS | | | PARALLAX PIXELS | PARALLAX LINE-UP DIRECTION (ARRANGEMENT) | CHARACTERISTICS |
|---|---|---|---|---|---|---|---|
| | | Gr | Gb | R, B | | | |
| TYPE A | Ao-1 | YES | YES | NO | Gr AND Gb IN ALTERNATING COLUMNS, AND Gb AND Gr IN ALTERNATING COLUMNS | ALTERNATING ODD-NUMBERED Gr IN Gr ROW, EVEN-NUMBERED Gb IN Gb ROW | IMAGE QUALITY OF 2D IMAGES MAINTAINED TO SOME EXTENT, 3D IMAGES CAN BE OBTAINED |
| | Ao-2 | | | | | ALTERNATING EVEN-NUMBERED Gr IN Gr COLUMN, ODD-NUMBERED Gb IN Gb COLUMN | |

FIG.20

⟨1⟩ WHEN n = 2

| REPEATING PATTERN TYPE | | PRESENCE OF PARALLAX PIXELS | | | PARALLAX PIXELS | PARALLAX ARRANGEMENT | CHARACTERISTICS |
|---|---|---|---|---|---|---|---|
| | | Gr | Gb | R, B | | | |
| TYPE A | A-1 | YES | YES | NO | Gr AND Gb, ALTERNATING L AND R | Gr IN Gr COLUMN, Gb IN Gb COLUMN | IMAGE QUALITY OF 2D IMAGES MAINTAINED TO SOME EXTENT, 3D IMAGES CAN BE OBTAINED |
| | A-2 | | | | | Gr IN Gr COLUMN, Gb IN Gb COLUMN | |
| TYPE B | B-1 | YES (NO) | NO (YES) | NO | EITHER Gr ONLY OR Gb ONLY | Gb IN Gb COLUMN (OR Gr IN Gr COLUMN) | 3D IMAGES CAN BE OBTAINED WITH THE SAME HIGH RESOLUTION AS 2D IMAGES |
| | B-2 | | | | | Gb IN Gb COLUMN (OR Gr IN Gr COLUMN) | |
| TYPE C | C-1 | YES | YES | NO | 2 PIXELS EACH OF Gr AND Gb | Gr IN Gr COLUMN, Gb IN Gb COLUMN | COLOR 3D IMAGES WITH RELATIVELY HIGH RESOLUTION AND 2D IMAGES WITH RELATIVELY LOW RESOLUTION CAN BE OBTAINED |
| | C-2 | | | | | Gr IN Gr COLUMN, Gb IN Gb COLUMN | |
| TYPE D | D-1 | YES | NO | YES | 3 PIXELS EACH OF Gr, R, AND B | R IN Gr COLUMN, B AND Gb IN Gb COLUMN | COLOR 3D IMAGES WITH SUFFICIENTLY HIGH QUALITY AND 2D IMAGE INFORMATION CAN BE OBTAINED |
| | D-2 | | | | | R IN Gr COLUMN, B AND Gb IN Gb COLUMN | |
| TYPE E | E-1 | YES | YES | YES | 4 PIXELS EACH OF Gr, Gb, R, AND B | Gr AND R IN Gr COLUMN, B AND Gb IN Gb COLUMN | RESOLUTION IS DECREASED, BUT COLOR 3D IMAGES WITH HIGHEST QUALITY CAN BE OBTAINED |
| | E-2 | | | | | Gr AND R IN Gr COLUMN, B AND Gb IN Gb COLUMN | |

FIG.22

⟨2⟩ WHEN n = 3

| REPEATING PATTERN TYPE | | PRESENCE OF PARALLAX PIXELS | | | PARALLAX PIXELS | PARALLAX ARRANGEMENT | CHARACTERISTICS |
|---|---|---|---|---|---|---|---|
| | | Gr | Gb | R, B | | | |
| TYPE A | At-1 | YES | YES | NO | Gr AND Gb | Gr IN Gr COLUMN, Gb IN Gb COLUMN | IMAGE QUALITY OF 2D IMAGES MAINTAINED TO SOME EXTENT, 3D IMAGES CAN BE OBTAINED |
| | At-2 | YES | YES | NO | | Gr IN Gr COLUMN, Gb IN Gb COLUMN | 3D IMAGES CAN BE OBTAINED WITH THE SAME HIGH RESOLUTION AS 2D IMAGES |
| TYPE B | Bt-1 | YES (NO) | NO (YES) | NO | EITHER Gr ONLY OR Gb ONLY | Gb IN Gb COLUMN (OR Gr IN Gr COLUMN) | THE ABOVE CHARACTERISTICS, AND RESOLUTION CAN BE ALLOCATED VERTICALLY AND HORIZONTALLY |
| | Bt-2 | YES (NO) | NO (YES) | NO | | Gb IN Gb COLUMN (OR Gr IN Gr COLUMN) | |
| | Bt-3 | | | | | Gr AND Gb ALTERNATELY IN Gr AND Gb COLUMNS | |
| TYPE C | Ct-1 | YES | YES | NO | 2 PIXELS EACH OF Gr AND Gb | Gr IN Gr COLUMN, Gb IN Gb COLUMN | COLOR 3D IMAGES WITH RELATIVELY HIGH RESOLUTION AND 2D IMAGES WITH RELATIVELY LOW RESOLUTION CAN BE OBTAINED |
| | Ct-2 | YES/NO | NO/YES | NO | | Gr IN Gr COLUMN, Gb IN Gb COLUMN | THE ABOVE CHARACTERISTICS, AND RESOLUTION CAN BE ALLOCATED VERTICALLY AND HORIZONTALLY |
| | Ct-3 | YES/NO | NO/YES | NO | | Gr IN Gr COLUMN, Gb IN Gb COLUMN | |
| TYPE D | Dt-1 | YES | NO | YES | 3 PIXELS EACH OF Gr, R, AND B | R AND Gb IN Gr COLUMN, B AND Gb IN Gb COLUMN | COLOR 3D IMAGES WITH SUFFICIENTLY HIGH QUALITY AND 2D IMAGE INFORMATION CAN BE OBTAINED |
| | Dt-2 | NO | YES | YES | | R AND Gb IN Gr COLUMN, B AND Gb IN Gb COLUMN | THE ABOVE CHARACTERISTICS, AND RESOLUTION CAN BE ALLOCATED VERTICALLY AND HORIZONTALLY |
| | Dt-3 | YES/NO | NO/YES | YES | | R AND Gb IN Gr COLUMN, B AND Gb IN Gb COLUMN | |
| TYPE E | Et-1 | YES | YES | YES | 4 PIXELS EACH OF Gr, Gb, R, AND B | Gr AND R IN Gr COLUMN, Gb AND B IN Gb COLUMN | RESOLUTION IS DECREASED, BUT COLOR 3D IMAGES WITH HIGHEST QUALITY CAN BE OBTAINED |
| | Et-2 | YES | YES | YES | | R AND Gb IN Gr COLUMN, B AND Gb IN Gb COLUMN | THE ABOVE CHARACTERISTICS, AND RESOLUTION CAN BE ALLOCATED VERTICALLY AND HORIZONTALLY |
| | Et-3 | | | | | R AND Gb IN Gr COLUMN, B AND Gb IN Gb COLUMN | |

FIG.23

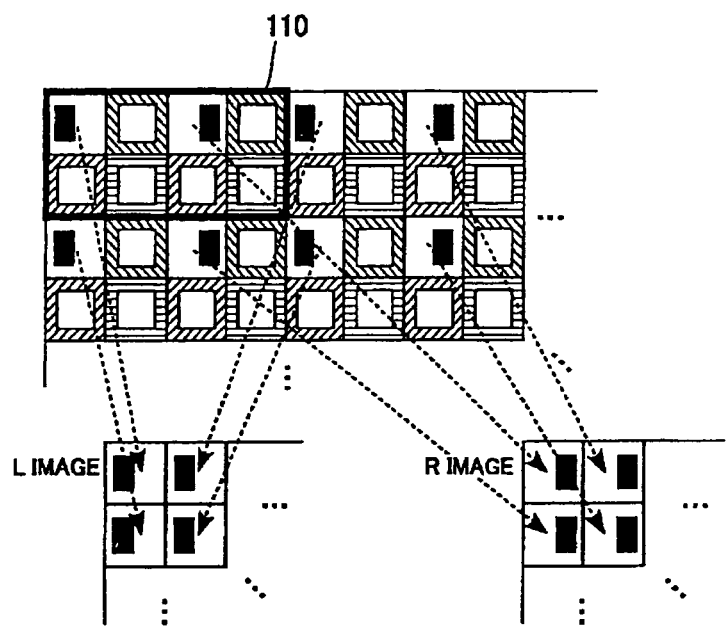
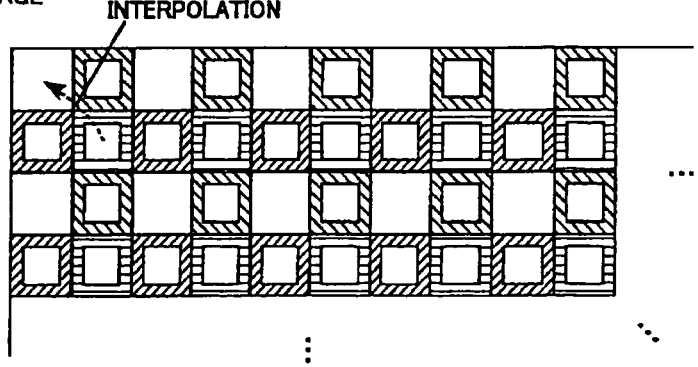
FIG.27

IMAGE SENSOR AND IMAGING DEVICE

BACKGROUND

1. Technical Field

The present invention relates to an image capturing element and an image capturing apparatus.

2. Related Art

A stereo image capturing apparatus is known that uses two image capturing optical systems to capture a stereo image formed by a left eye image and a right eye image. This stereo image capturing apparatus causes a parallax in the two images acquired from capturing the same subject, by arranging the two image capturing optical systems at a prescribed distance from each other.

Patent Document 1: Japanese Patent Application Publication No. H08-47001

However, in order to capture an image having a plurality of parallaxes, it is necessary to use a corresponding number of complex image capturing optical systems.

SUMMARY

Therefore, according to a first aspect related to the innovations herein, provided is an image capturing element comprising photoelectric converting elements that are arranged two-dimensionally and photoelectrically convert incident light into an electric signal; aperture masks that correspond one-to-one with the photoelectric converting elements; and color filters that correspond one-to-one with the photoelectric converting elements. Among n adjacent photoelectric converting elements, where n is an integer no less than three, apertures of the aperture masks corresponding to at least three of the photoelectric converting elements are included within each pattern of a color filter pattern formed from at least two types of the color filters that respectively pass different wavelength bands, and are positioned to respectively pass light from different partial regions within a cross-sectional region of the incident light, and photoelectric converting element groups that are each formed of the n photoelectric converting elements are arranged in series.

According to a second aspect related to the innovations herein, provided is an image capturing element comprising photoelectric converting elements that are arranged two-dimensionally and photoelectrically convert incident light into an electric signal; and aperture masks that correspond one-to-one with the photoelectric converting elements. Among n adjacent photoelectric converting elements, where n is an integer no less than three, apertures of the aperture masks corresponding to at least three of the photoelectric converting elements are positioned to respectively pass light from different partial regions within a cross-sectional region of the incident light, and photoelectric converting element groups that are each formed of the n photoelectric converting elements are arranged in series.

According to a third aspect related to the innovations herein, provided is an image capturing element comprising photoelectric converting elements that are arranged two-dimensionally and photoelectrically convert incident light into an electric signal; and aperture masks that correspond one-to-one with the photoelectric converting elements. Among n adjacent photoelectric converting elements, where n is an integer no less than three, apertures of the aperture masks corresponding to at least three of the photoelectric converting elements are positioned to respectively pass light from different partial regions of the incident light, photoelectric converting element groups that are each formed of the n photoelectric converting elements are arranged in series, and the image capturing element further comprises waveguides that at least reduce scattering of incident light passed through the aperture masks and guide the incident light to the photoelectric converting elements.

According to a fourth aspect related to the innovations herein, provided is an image capturing element comprising photoelectric converting elements that are arranged two-dimensionally and photoelectrically convert incident light into an electric signal; aperture masks that correspond one-to-one with the photoelectric converting elements; and color filters that correspond one-to-one with the photoelectric converting elements. Among n adjacent photoelectric converting elements, where n is an integer no less than three, apertures of the aperture masks corresponding to at least three of the photoelectric converting elements are included within each pattern of a color filter pattern formed from at least two types of the color filters that respectively pass different wavelength bands, and are positioned to respectively pass light from different partial regions within a cross-sectional region of the incident light, photoelectric converting element groups that are each formed of the n photoelectric converting elements are arranged in series, and the image capturing element further comprises waveguides that at least reduce scattering of incident light passed through the aperture masks and guide the incident light to the photoelectric converting elements.

According to a fifth aspect related to the innovations herein, provided is an image capturing apparatus comprising the image capturing element described above; and an optical component that guides light to the image capturing element.

The summary clause does not necessarily describe all necessary features of the embodiments of the present invention. The present invention may also be a sub-combination of the features described above.

BRIEF DESCRIPTION OF THE DRAWINGS

FIG. 13 describes variations for the allocation of parallax pixels in the Bayer arrangement in which there are two types of parallax pixels.

FIG. 18 describes allocation of parallax pixels in a Bayer arrangement for variations in which there are three types of parallax pixels.

FIG. 20 describes exemplary variations for allocating parallax pixels in a Bayer arrangement when there are four or more types of parallax pixels.

FIG. 22 describes exemplary variations for allocating parallax pixels in another color filter arrangement when there are two types of parallax pixels.

FIG. 23 describes exemplary variations for allocating parallax pixels in another color filter arrangement when there are three types of parallax pixels.

FIG. 27 is a schematic view showing the process for generating a 2D image and a parallax image.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

A digital camera according to the present embodiment, which is one aspect of an image capturing apparatus, is able to obtain images from a plurality of view points in one scene with a single image capturing. Each image having different viewpoints is referred to as a "parallax image."

Figure 1:
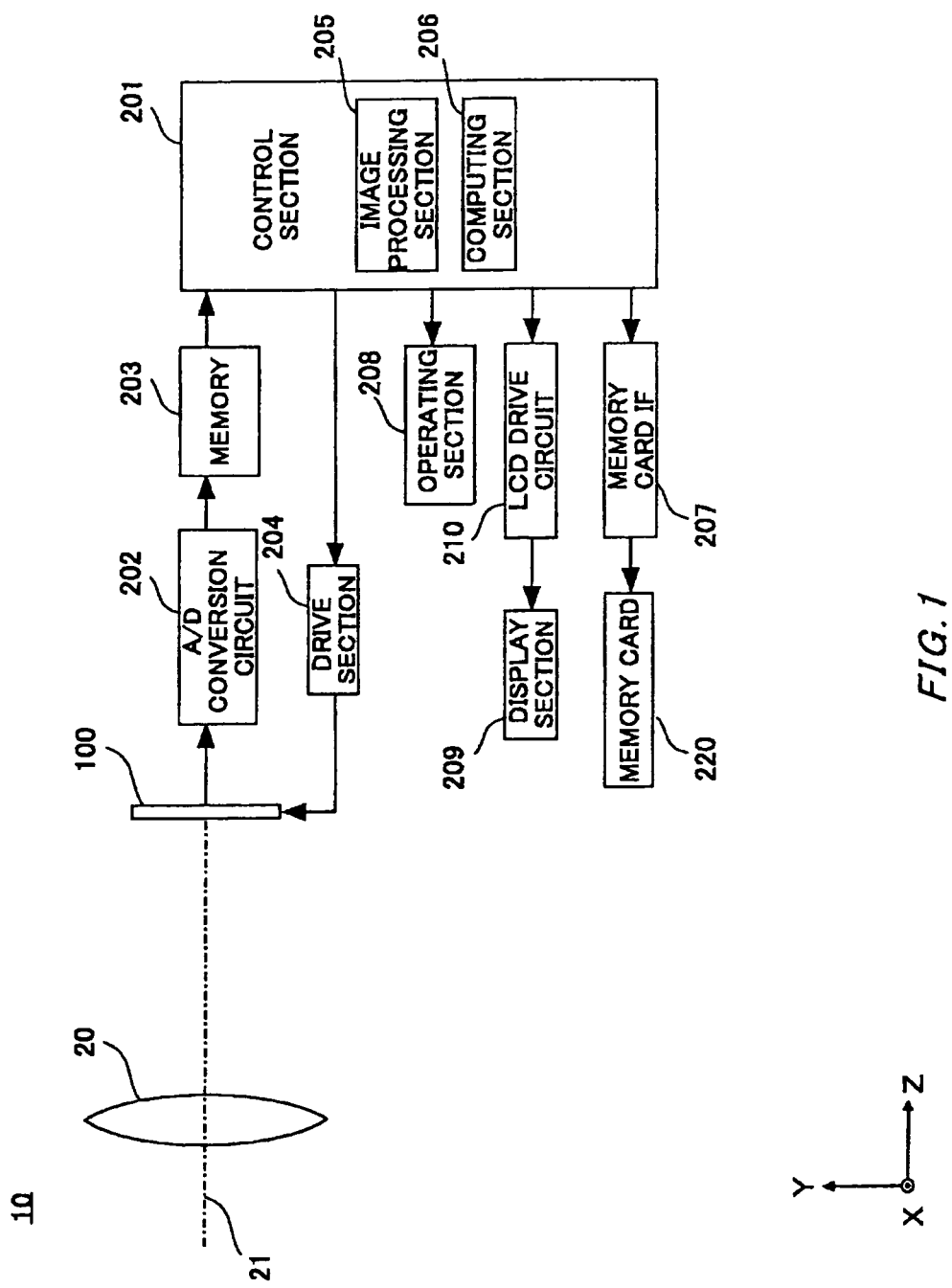
FIG. 1 shows a configuration of a digital camera according to an embodiment of the present invention.

FIG. 1 shows a configuration of a digital camera 10 according to an embodiment of the present invention. The digital camera 10 includes an image capturing lens 20 as an image capturing optical system, and guides subject light that is incident along an optical axis 21 thereof to an image capturing element 100. The image capturing lens 20 may be an exchangeable lens that can be attached to the digital camera 10. The digital camera 10 includes the image capturing element 100, a control section 201, an A/D conversion circuit 202, a memory 203, a driving section 204, a memory card IF 207, an operation section 208, a displaying section 209, and an LCD drive circuit 210.

As shown in FIG. 1, a direction parallel to the optical axis 21 toward the image capturing element 100 is defined as the z-axis, a direction orthogonal to the plane of the z-axis and moving upward from the plane of the drawing is defined as the x-axis, and a direction upward within the plane of the drawing is defined as the y-axis. In several of the following drawings, the coordinate axes of FIG. 1 are used as a reference to display the orientation of the drawings on coordinate axes.

The image capturing lens 20 is formed by a plurality of optical lens groups, and focuses the subject light from a scene near a focal plane thereof. In FIG. 1, for ease of explanation, the image capturing lens 20 is represented by a single virtual lens arranged near the pupil. The image capturing element 100 is arranged near the focal plane of the image capturing lens 20. The image capturing element 100 is an image sensor, such as a CCD or CMOS sensor, in which a plurality of photoelectric converting elements are arranged two-dimensionally. The timing of the image capturing element 100 is controlled by the driving section 204, and the image capturing element 100 converts a subject image focused on a light receiving surface into an image signal and outputs the image signal to the A/D conversion circuit 202.

The A/D conversion circuit 202 converts the image signal output by the image capturing element 100 into a digital image signal, and outputs the digital image signal to the memory 203. The image processing section 205, which is a portion of the control section 201, performs various image processing using the memory 203 as a work space, to generate image data. For example, when generating image data in a JPEG file format, the image processing section 205 performs white balance processing, gamma processing, or the like, and then performs compression. The generated image data is converted into a display signal by the LCD drive circuit 210, and displayed in the displaying section 209. The generated image data may be recorded in a memory card 220 inserted in the memory card IF 207.

A series of image capturing sequences is begun as a result of the operation section 208 receiving user manipulation to output a manipulation signal to the control section 201. Each type of associated operation, such as AF or AE, is executed according to a computation result of the computing section 206.

The digital camera 10 includes a parallax image capturing mode in addition to the normal image capturing mode. The user can select one of these modes by manipulating the operation section 208 while viewing the displaying section on which a menu screen is displayed.

Figure 2:
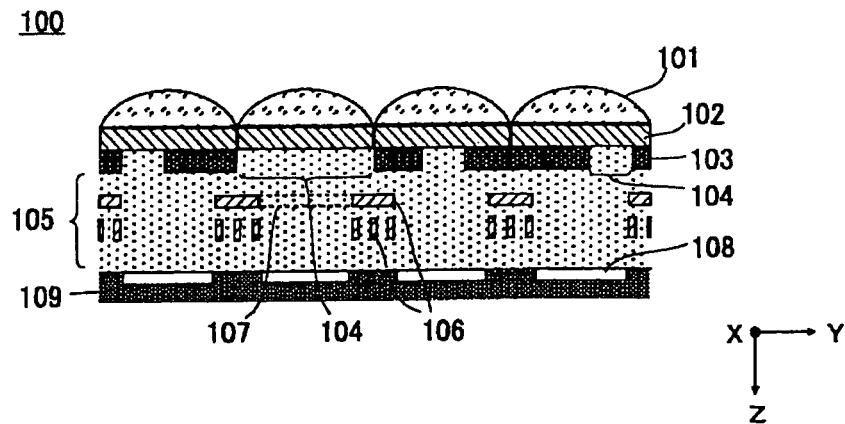
FIG. 2 is a schematic view showing a cross section of the image capturing element according to the present embodiment of the present invention.

The following describes a configuration of the image capturing element 100. FIG. 2 is a schematic view showing a cross section of the image capturing element 100 according to an embodiment of the present invention.

The image capturing element 100 is formed by arranging microlenses 101, color filters 102, aperture masks 103, a wiring layer 105, and photoelectric converting elements 108 in the stated order from the subject side. The photoelectric converting elements 108 are each formed by a photodiode that converts incident light into an electrical signal. A plurality of the photoelectric converting elements 108 are arranged two-dimensionally on the surface of a substrate 109.

The image signals resulting from the conversion by the photoelectric converting elements 108 and the control signals for controlling the photoelectric converting elements 108, for example, are transmitted and received by wiring 106 provided in the wiring layer 105. Each aperture mask 103 of the aperture portions 104 corresponding one-to-one with the photoelectric converting elements 108 is in contact with the wiring layer. As described further below, the aperture portions 104 are strictly positioned at locations shifted relative to the corresponding photoelectric converting elements 108. The specifics are described further below, but the aperture masks 103 of the aperture portions 104 function to create parallaxes in the subject light received by the photoelectric converting elements 108.

There are no aperture masks 103 provided for photoelectric converting elements 108 that do not cause a parallax. In other words, it could also be said that there are aperture masks 103 including aperture portions 104 that pass all effective light, i.e. that do not limit the subject light incident to the corresponding photoelectric converting elements 108. Although no parallax is caused, the aperture 107 formed by the wiring 106 substantially determines the incident subject light, and therefore the wiring 106 can be thought of as an aperture mask that passes all effective light and does not cause a parallax. Each aperture mask 103 may be arranged independently in correspondence with a photoelectric converting element 108, or the aperture masks 103 may be formed en bloc for a plurality of photoelectric converting elements 108 using the same manufacturing process as used for the color filters 102.

The color filters 102 are provided on the aperture masks 103. The color filters 102 correspond one-to-one with the photoelectric converting elements 108, and each color filter 102 is colorized to pass a specified wavelength band to the corresponding photoelectric converting element 108. In order to output a color image, it is only necessary to arrange two different types of color filters, but a higher quality color image can be obtained if three or more types of color filters are provided. For example, red filters that pass a red wavelength band, green filters that pass a green wavelength band, and blue filters that pass a blue wavelength band may be arranged in a grid. More detailed arrangements are described further below.

The microlenses 101 are provided on the color filters 102. Each microlens 101 is a converging lens that guides a majority of the subject light incident thereto to the corresponding photoelectric converting element 108. The microlenses 101 correspond one-to-one with the photoelectric converting elements 108. Each microlens 101 preferably has the optical axis thereof shifted to guide more subject light to the corresponding photoelectric converting element 108, with consideration to the relative positions of the center of the image capturing lens 20 and the corresponding photoelectric converting element 108. Furthermore, in addition to adjusting the positioning of the aperture masks 103 of the aperture portions 104, the positioning of the microlenses 101 may be adjusted such that more of the specified subject light, described further below, is incident.

In this way, the single unit of an aperture mask 103, a color filter 102, and a microlens 101 provided one-to-one for each photoelectric converting element 108 is referred to as a "pixel." More specifically, a pixel including an aperture mask 103 that causes a parallax is referred to as a "parallax pixel," and a pixel including an aperture mask 103 that does not cause a parallax is referred to as a "non-parallax pixel." If the effective pixel region of the image capturing element 100 is approximately 24 mm by 16 mm, there may be approximately 12 million pixels, for example.

If the image sensor has good collection efficiency and photoelectric conversion efficiency, the microlenses 101 need not be provided. If only a black and whit image signal is to be output, the color filters 102 are not provided. If a back-illuminated image sensor is used, the wiring layer 105 is provided on the opposite side of the photoelectric converting elements 108. If the aperture portions 104 of the aperture masks 103 have a color component, the color filters 102 and the aperture masks 103 can be formed integrally.

Figure 3:
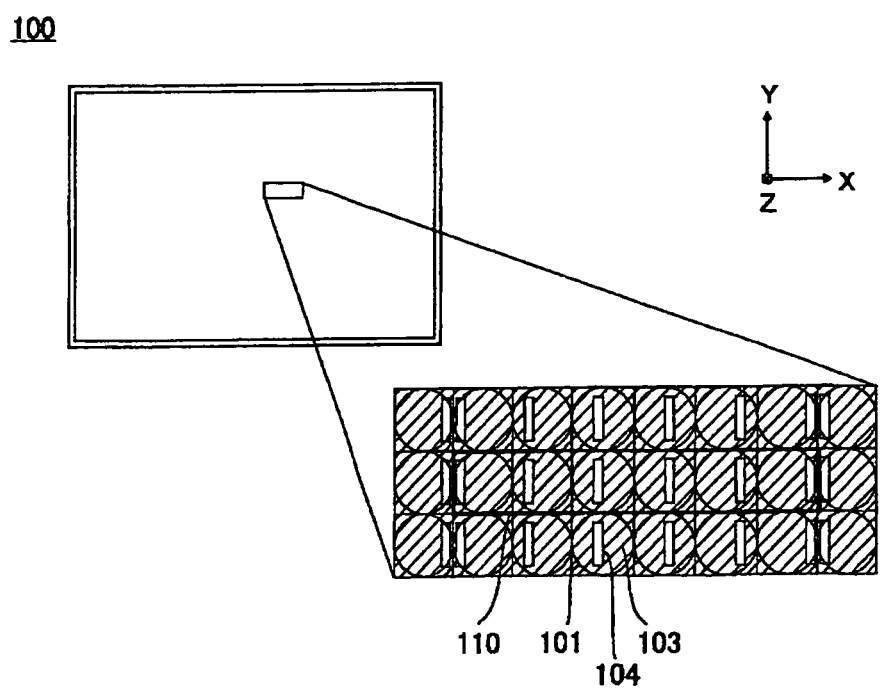
FIG. 3 is a schematic view showing a magnified portion of the image capturing element.

The following describes the relation ship between the aperture portions 104 of the aperture masks 103 and the resulting parallaxes. FIG. 3 is a schematic view showing a magnified portion of the image capturing element 100. For ease of explanation, the color arrangement of the color filters 102 is not discussed at this point, and is instead brought up later. If the image capturing element 100 does not include color filters 102, the image capturing element 100 can serve as a monochromatic image sensor and generate monochromatic parallax images. In the following description that does not deal with coloring of the color filters 102, it can be assumed that the image sensor is formed by gathering together only parallax pixels having color filters 102 of the same color. Accordingly, the repeating pattern described below may be thought of as adjacent pixels in color filters 102 of the same color.

As shown in FIG. 3, the aperture portions 104 of the aperture masks 103 are shifted relative to the pixels. In adjacent pixels, the aperture portions 104 are located at different positions.

In the example of FIG. 3, there are six types of aperture masks 103 in which the aperture portions 104 are shifted to horizontally different positions with respect to the pixels. The overall image capturing element 100 is formed by periodically and two-dimensionally arranging groups of photoelectric converting elements including six sets of parallax pixels having aperture masks 103 that are gradually shifted from the left side to the right side in FIG. 3. In other words, in the image capturing element 100, repeating patterns 110 that each include one group of photoelectric converting elements are disposed periodically and continuously. However, the repeating pattern 110 may be such that the photoelectric converting element groups are arranged continuously in at least one direction in a two-dimensional plane, and may be non-continuous in the other direction. The image capturing element 100 may include a portion in which a portion of the repeating patterns 110 are omitted, in a range in which the parallax images can be substantially generated. The range in which the parallax images can be generated may be a range in which an image can be interpolated without discrepancies. Furthermore, substantially parallactic images can be generated even when the portions of the repeating patterns 110 that are omitted are in a peripheral region that does not have a visual effect.

Figure 4A:
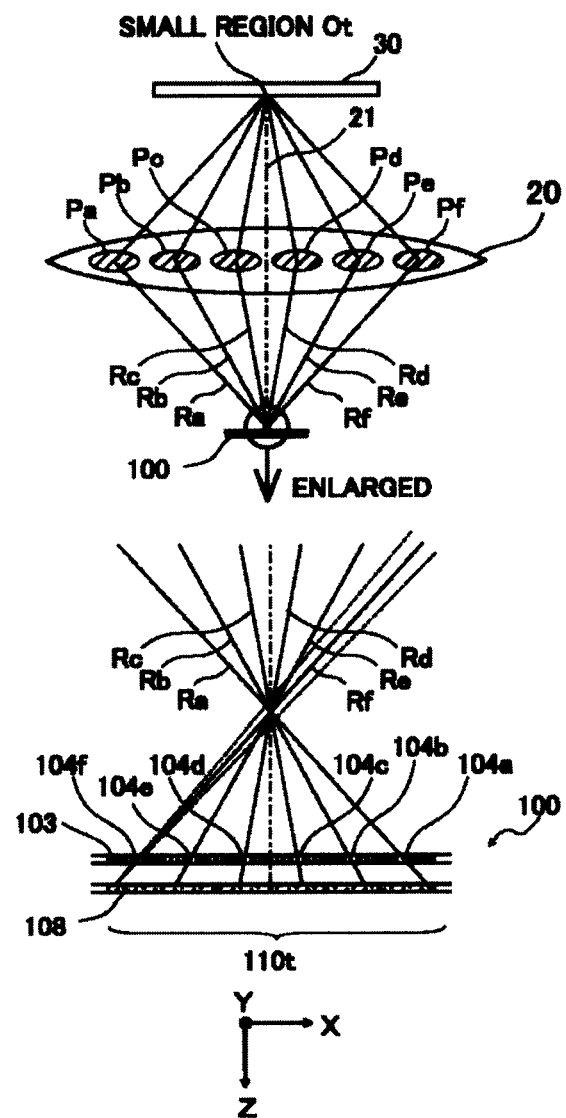
FIG. 4A shows a photoelectric converting element group of a repeating pattern arranged in the center of the image capturing element orthogonal to the image capturing optical axis.
Figure 4B:
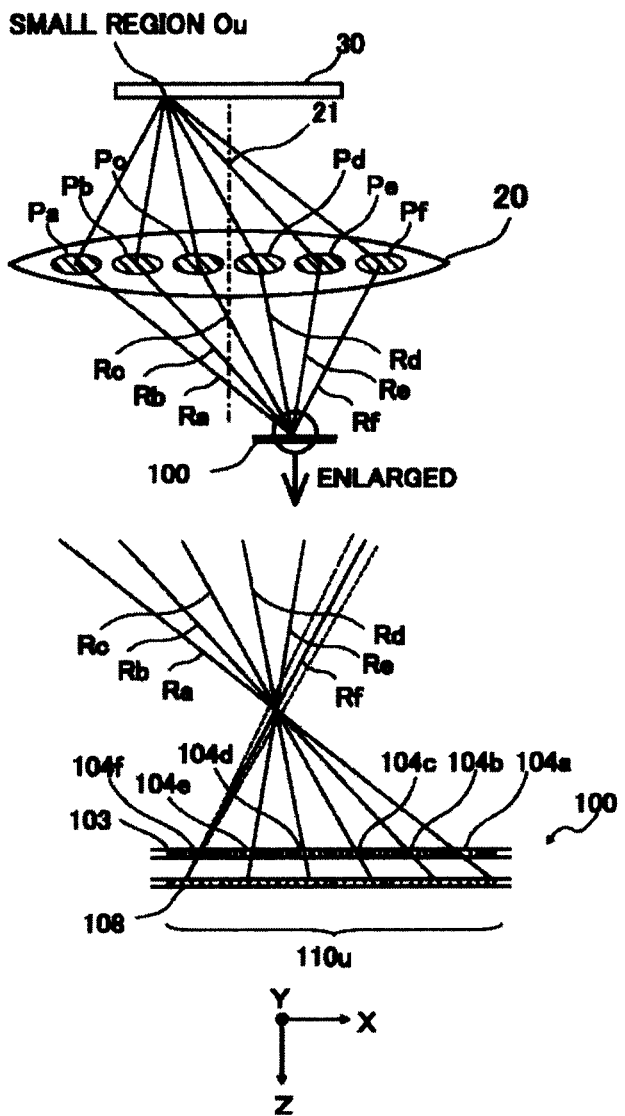
FIG. 4B schematically shows a photoelectric converting element group of a repeating pattern arranged in a peripheral region.
Figure 4C:
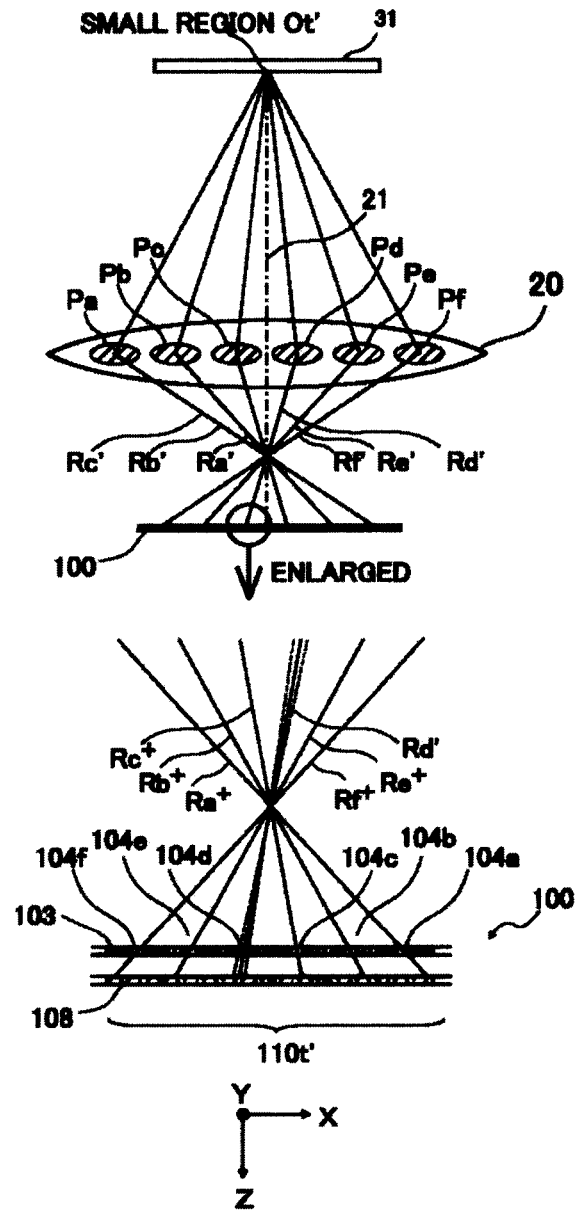
FIG. 4C schematically shows the relationship when the subject is at an unfocused position of the image capturing lens.

FIGS. 4A, 4B, and 4C are schematic views for describing the relationship between the parallax pixels and the subject. FIG. 4A shows a photoelectric converting element group of a repeating pattern 110t arranged in the center of the image capturing element 100 orthogonal to the image capturing optical axis 21, and FIG. 4B schematically shows a photoelectric converting element group of a repeating pattern 110u arranged in a peripheral region. The subject 30 in FIGS. 4A and 4B is located at a focused position of the image capturing lens 20. FIG. 4C schematically shows the relationship corresponding to FIG. 4A when the subject 31 is at an unfocused position of the image capturing lens 20.

The following describes the relationship between the parallax pixels and the subject when the image capturing lens 20 captures a subject 30 in a focused state. The subject light passes through the eye of the image capturing lens 20 and is guided to the image capturing element 100, and six partial regions Pa to Pf are defined in the overall cross-sectional region through which the subject light passes. As shown in the magnified portion as well, the position of the aperture portion 104f of the aperture mask 103 is set such that the pixels at the left edges of the photoelectric converting element groups forming the repeating patterns 110t and 110u cause only the subject light emitted from the partial region Pf to reach the photoelectric converting element 108. Progressing to pixels closer to the right edge, the position of the aperture portion 104e corresponding to the partial region Pe, the position of the aperture portion 104d corresponding to the partial region Pd, the position of the aperture portion 104c corresponding to the partial region Pc, the position of the aperture portion 104b corresponding to the partial region Pb, and the position of the aperture portion 104a corresponding to the partial region Pa are each determined in the same manner.

In other words, the inclination of the primary light ray Rf of the subject light emitted from the partial region Pf, which is determined according to the relative position of the left edge pixel with respect to the partial region PF, for example, can be said to determine the position of the aperture portion 104f. When the photoelectric converting element 108 receives the subject light from the subject 30 at the focused position via the aperture portion 104f, the subject light is focused on the photoelectric converting element 108 as shown by the dashed lines. Similarly, for pixels further toward the right edge, the position of the aperture portion 104e is determined by the inclination of the primary light ray Re, the position of the aperture portion 104d is determined by the inclination of the primary light ray Rd, the position of the aperture portion 104c is determined by the inclination of the primary light ray Rc, the position of the aperture portion 104b is determined by the inclination of the primary light ray Rb, and the position of the aperture portion 104a is determined by the inclination of the primary light ray Ra.

As shown in FIG. 4A, the light emitted from the small region Ot of the subject 30 orthogonal to the optical axis 21 and located at the focused position passes through the eye of the image capturing lens 20 to arrive at each of the pixels in the photoelectric converting element group that forms the repeating pattern 110t. More specifically, the pixels of the photoelectric converting element group that forms the repeating pattern 110t each receive light emitted from the one small region Ot, respectively through the six partial regions Pa to Pf. The small region Ot widens by an amount corresponding to the positional shift of each pixel of the photoelectric converting element group that forms the repeating pattern 110t, but can substantially approximate an object point that is substantially the same. Similarly, as shown in FIG. 4B, the light emitted from the small region Ou of the subject 30 distanced from the optical axis 21 and located at the focused position passes through the eye of the image capturing lens 20 to arrive at each of the pixels in the photoelectric converting element group that forms the repeating pattern 110u. More specifically, the pixels of the photoelectric converting element group that forms the repeating pattern 110u each receive light emitted from the one small region Ou, respectively through the six partial regions Pa to Pf. In the same manner as the small region Ot, the small region Ou widens by an amount corresponding to the positional shift of each pixel of the photoelectric converting element group that forms the repeating pattern 110t, but can substantially approximate an object point that is substantially the same.

In other words, as long as the subject 30 is located at the focused position, the small region captured by the photoelectric converting element group differs according to the position of the repeating pattern 110 on the image capturing element 100, and each pixel in the photoelectric converting element group captures the same small region via a different partial region. Corresponding pixels in each repeating pattern 110 receive subject light from the same partial region. In other words, in the drawings, the pixels at the left edges of the repeating patterns 110t and 110u each receive subject light from the same partial region Pf.

Strictly speaking, the position of the aperture portion 104f through which the left edge pixel in the repeating pattern 110t arranged orthogonal to the image capturing optical axis 21 at the center thereof receives the subject light from the partial region Pf differs from the position of the aperture portion 104f through which the left edge pixel in the repeating pattern 110u arranged at the periphery of the image capturing optical axis receives the subject light from the partial region Pf. However, from a functional point of view, these aperture masks can be treated as being the same type with respect to receiving subject light from the partial region Pf. Accordingly, in the examples of FIGS. 4A and 4B, each of the parallax pixels arranged on the image capturing element 100 can be considered as having one of six types of aperture masks.

The following describes the relationship between the parallax pixels and the subject when the image capturing lens 20 captures the subject 31 in an unfocused state. In this case as well, the subject light from the subject 31 located at an unfocused position passes through the six partial regions Pa to Pf of the eye of the image capturing lens 20 to arrive at the image capturing element 100. It should be noted that the subject light from the subject 31 at the unfocused position converges at a position that is not on the photoelectric converting element 108. For example, as shown in FIG. 4C, when the subject 31 is further from the image capturing element 100 than the subject 30, the subject light converges on the subject 31 side of the photoelectric converting element 108. Inversely, when the subject 31 is closer to the image capturing element 100 than the subject 30, the subject light converges on a side of the photoelectric converting element 108 opposite the subject 31.

Accordingly, the subject light emitted from a small region Ot' of the subject 31 located at the unfocused position arrives at corresponding pixels of different repeating patterns 110 depending on which of the six partial regions Pa to Pf the subject light passes through. For example, as shown in FIG. 4C, the subject light that passes through the partial region Pd is a primary light ray Rd' incident to the photoelectric converting element 108 having that aperture portion 104d included in the repeating pattern 110t'. Among the subject light emitted from the small region Ot', the subject light passing through another partial region is not incident to a photoelectric converting element 108 included in the repeating pattern 110t', and is instead incident to a photoelectric converting element 108 having an aperture portion corresponding to another repeating pattern. In other words, the subject light arriving at each of the photoelectric converting elements 108 forming the repeating pattern 110t' is respectively emitted from different small regions of the subject 31. Specifically, subject light in which the primary light ray is Rd' is incident to the 108 corresponding to the aperture portion 104d, and a plurality of types of subject light in which the primary light rays are respectively Ra$^+$, Rb$^+$, Rc$^+$, Re$^+$, and Rf$^+$ are input to the corresponding photoelectric converting elements 108 of other aperture portions. Each of these types of subject light is emitted from a different small region of the subject 31. This relationship is the same in the repeating pattern 110u arranged in the peripheral region shown in FIG. 4B.

Therefore, when viewed with the entire image capturing element 100, the subject image A captured by the photoelectric converting element 108 corresponding to the aperture portion 104a and the subject image D captured by the photoelectric converting element 108 corresponding to the aperture portion 104d, for example, do not have a skew therebetween when the subject is at the focused position and do have a skew therebetween when the subject is at an unfocused position. The amount and direction of this skew depend on the distance between the partial region Pa and the partial region Pd and on which direction the subject at the unfocused position is located with respect to the focused position. In other words, the subject image A and the subject image D are parallax images with respect to each other. This relationship is the same for each of the other aperture portions, and therefore six parallax images are formed corresponding to the aperture portions 104a to 104f.

Accordingly, when the outputs of corresponding pixels in each of the repeating patterns 110 formed in this way are gathered, a parallax image is obtained. Specifically, the outputs of the pixels that receive the subject light emitted from a prescribed partial region among the six partial regions Pa to Pf form a parallax image.

Figure 5:
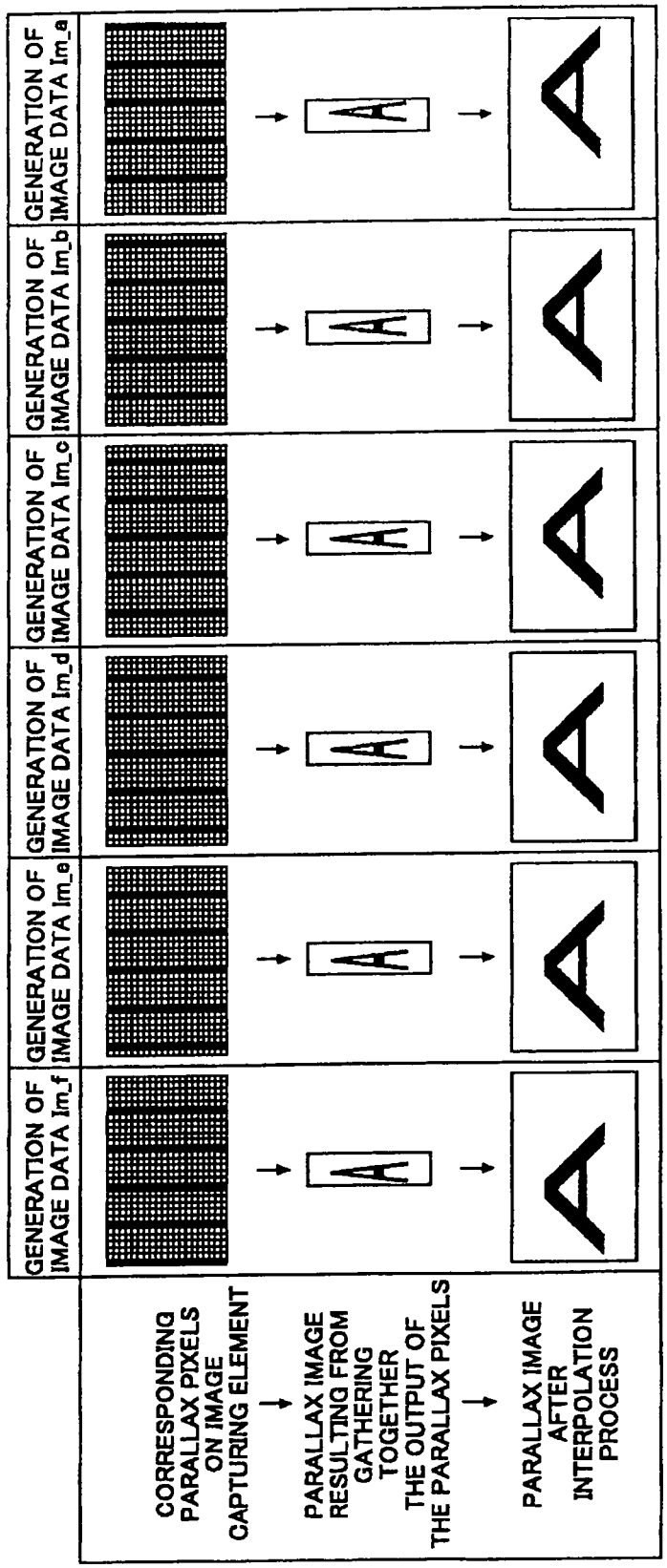
FIG. 5 is a schematic view for describing the process of generating parallax images.

FIG. 5 is a schematic view for describing the process of generating parallax images. FIG. 5 shows, from left to right, generation of parallax image data Im_f generated by gathering the outputs of the parallax pixels corresponding to the aperture portions 104f, generation of parallax image data Im_e resulting from the outputs of the aperture portions 104e, generation of parallax image data Im_d resulting from the outputs of the aperture portions 104d, generation of parallax image data Im_c resulting from the outputs of the aperture portions 104c, generation of parallax image data Im_b resulting from the outputs of the aperture portions 104b, and generation of parallax image data Im_a resulting from the outputs of the aperture portions 104a. First, generation of the parallax image data Im_f resulting from the outputs of the aperture portions 104f will be described.

The repeating patterns 110 formed respectively by groups of photoelectric converting elements including a set of six parallax pixels are arranged in horizontal lines. Accordingly, the parallax pixels of the aperture portions 104f are every sixth pixel in the horizontal direction on the image capturing element 100, and are adjacent in series in the vertical direction. Each of these pixels receives subject light from a different small region, in the manner described above. Accordingly, a parallax image can be obtained by gathering and arranging the outputs of these parallax pixels.

However, since each pixel of the image capturing element 100 according to the present embodiment is square, merely gathering the pixels together results in these pixels being thinned to one of every six pixels in the horizontal direction, and the generated image data is therefore stretched vertically. Therefore, the parallax image data Im_f is generated as an image with a conventional aspect ratio by performing interpolation to obtain six times the number of pixels in the horizontal direction. It should be noted that the parallax image data prior to the interpolation is an image thinned to 1/6 in the horizontal direction, and therefore the resolution in the horizontal direction is lower than the resolution in the vertical direction. In other words, the number of pieces of parallax image data generated has an inverse relationship with improvement of the resolution.

In the same manner, the parallax image data Im_e to Im_a is obtained. In other words, the digital camera 10 can generate the parallax images from six view points that have parallaxes therebetween in the horizontal direction.

Figure 6A:
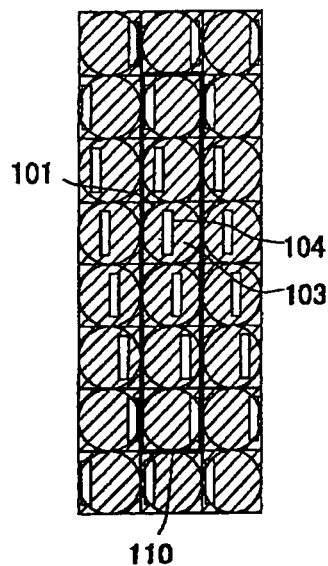
FIG. 6A shows an exemplary repeating pattern in which six pixels are arranged vertically.
Figure 6B:
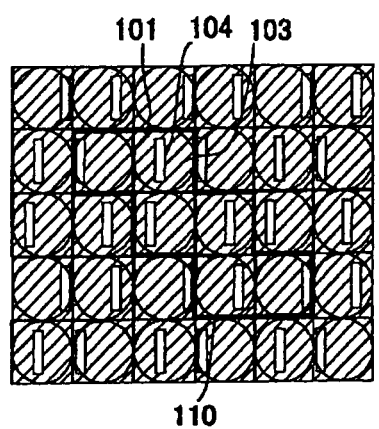
FIG. 6B shows an exemplary repeating pattern in which six pixels are arranged diagonally adjacent.

In the above example, horizontal rows are arranged periodically as the repeating patterns 110, but the repeating patterns 110 are not limited to this. FIGS. 6A and 6B show other examples of the repeating patterns 110.

FIG. 6A shows an exemplary repeating pattern 110 in which six pixels are arranged vertically. Here, the position of each aperture portion 104 is gradually shifted from the left side to the right side, in a direction from the pixel at the top edge to the pixel at the bottom edge. The repeating patterns 110 arranged in this way can also generate parallax images from six view points having horizontal parallaxes therebetween. Compared to the repeating pattern 110 of FIG. 3, this repeating pattern maintains the horizontal resolution in exchange for sacrificing the vertical resolution.

FIG. 6B shows an exemplary repeating pattern 110 in which six pixels in a diagonal direction are arranged adjacent to each other. The position of each aperture portion 104 is gradually shifted from the left side to the right side, in a direction from the pixel at the upper left edge to the pixel at the bottom right edge. The repeating patterns 110 arranged in this way can also generate parallax images with six view points having horizontal parallaxes therebetween. Compared to the repeating pattern 110 of FIG. 3, this repeating pattern can increase the number of parallax images while maintaining both the vertical and horizontal resolution to a certain degree.

In a comparison between the repeating patterns 110 of FIGS. 3, 6A, and 6B, when generating parallax images with six view points, each repeating pattern 110 differs by sacrificing either vertical resolution or horizontal resolution with respect to the resolution obtained when outputting one image that is not a parallax image from an arrangement that is entirely non-parallax pixels. When the repeating pattern 110 of FIG. 3 is used, the horizontal resolution becomes 1/6. When the repeating pattern 110 of FIG. 6A is used, the vertical resolution becomes 1/6. When the repeating pattern 110 of FIG. 6B is used, the vertical resolution becomes 1/3 and the horizontal resolution becomes 1/2. In each case, one of each of the aperture portions 104a to 104f corresponding to the pixels is provided in each pattern, and the subject light is received from each of the corresponding partial regions Pa to Pf. Accordingly, the parallax amount is the same for each repeating pattern 110.

With the repeating patterns 110 described above, there is a tradeoff between the resolution and the number of parallaxes, and the following describes a technique for a phase shift arrangement that increases the resolution without decreasing the number of parallaxes. First, a basic configuration that does not include the phase shift arrangement will be described.

Figure 7:
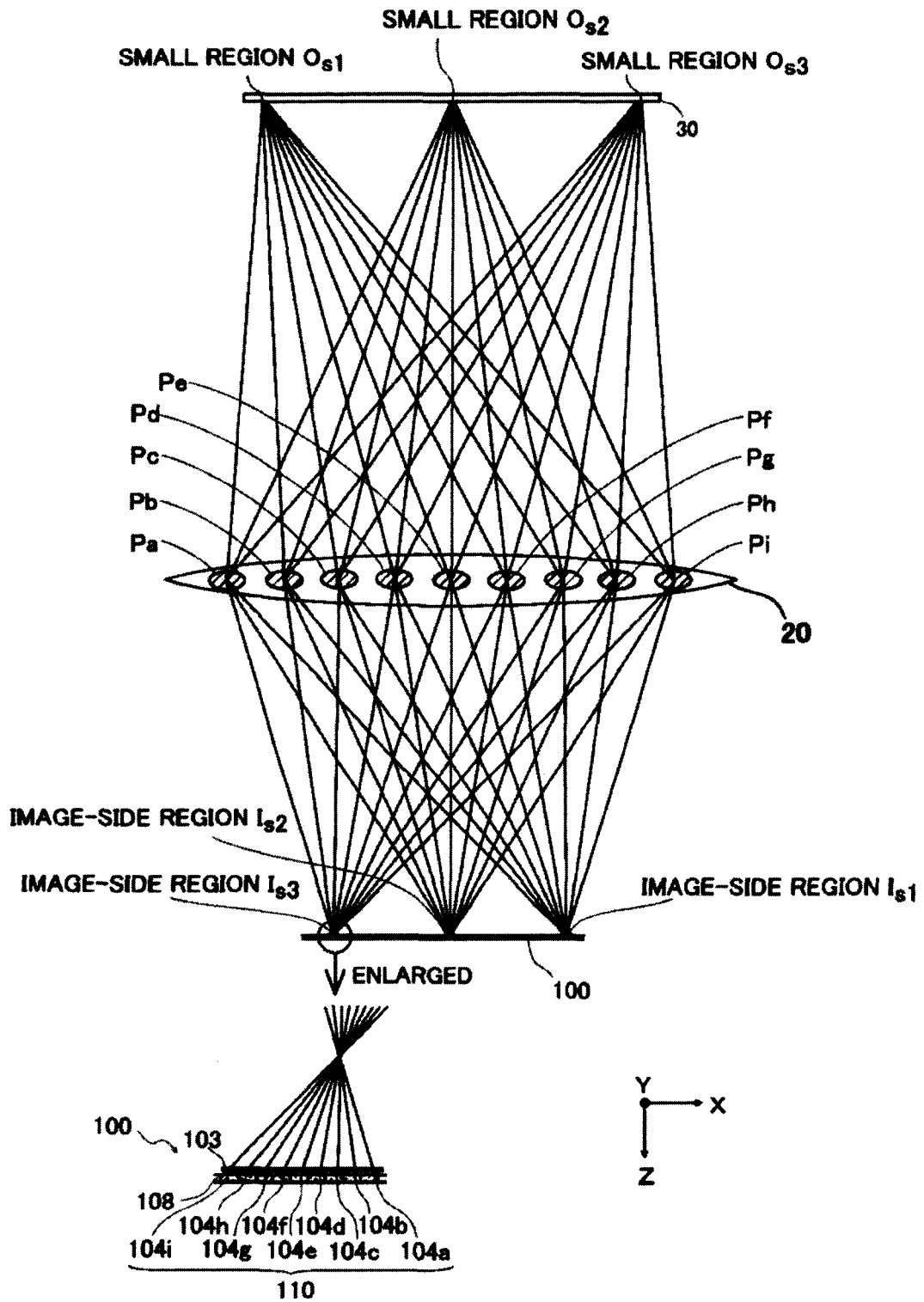
FIG. 7 is a schematic view for describing the relationship between the subject and parallax pixels that are not in the phase shift arrangement

FIG. 7 is a schematic view for describing the relationship between the subject and parallax pixels that are not in a phase shift arrangement. The repeating pattern 110 shown in FIG. 7 passes only the subject light from the partial regions Pa to Pi in the eye of the image capturing lens 20 respectively through the aperture portions 104a to 104i in the corresponding parallax pixels, and therefore the image capturing element 100 outputs a parallax image with nine view points. In this case, the nine parallax pixels receive light emitted from the same small region, and therefore the resolution is 1/9 of the resolution obtained when each of the nine pixels receives light emitted from a different small region. For example, the subject light emitted from the small region $O_{s3}$ of the subject 30 located at the focused position is split by passing through the nine partial regions Pa to Pi and focused at the image-side region $I_{s3}$. The image-side region $I_{s3}$ is a region corresponding to one repeating pattern 110 that includes the aperture portions 104a to 104i.

In the same manner, the subject light emitted from the small region $O_{s2}$ passes through the nine partial regions Pa to Pi and is focused at the image-side region $I_{s2}$. The subject light emitted from the small region $O_{s1}$ passes through the nine partial regions Pa to Pi and is focused at the image-side region $I_{s1}$. The image-side regions $I_{s2}$ and $I_{s3}$ are regions that each correspond to one repeating pattern 110 including aperture portions 104a to 104i. In other words, the small regions and the repeating patterns 110 have a one-to-one correspondence. Accordingly, the aperture portions 104a to 104i arranged in the parallax pixels are arranged in order within the corresponding repeating pattern 110. In FIG. 7, the aperture portion 104a is arranged in the parallax pixel at the right edge of the repeating pattern 110, and the aperture portions 104b, c, etc. are arranged in order towards the left until reaching the aperture portion 104i arranged in the parallax pixel at the left edge. This arrangement is the same in each repeating pattern 110 of the image capturing element 100.

Figure 8:
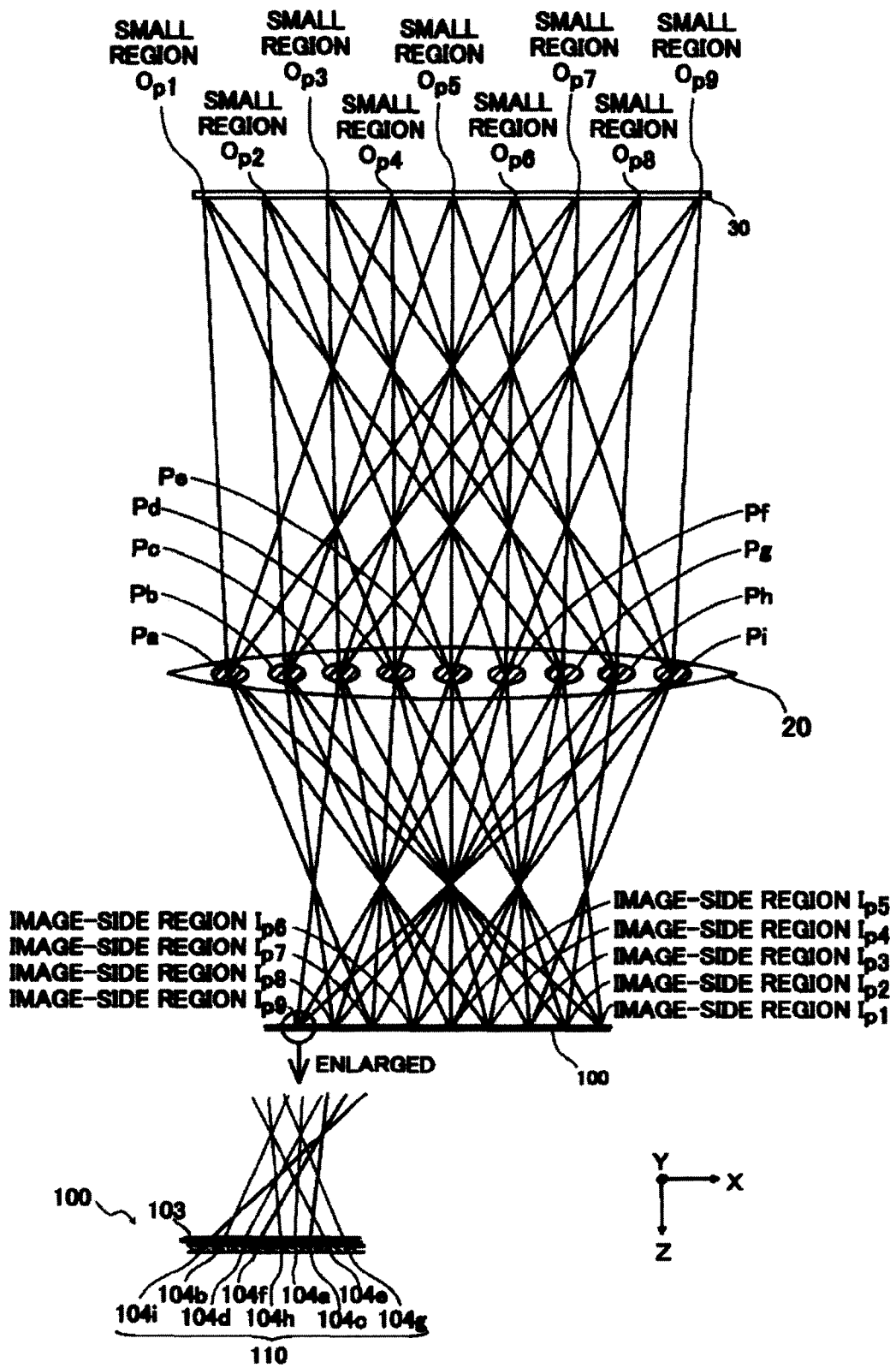
FIG. 8 is a schematic view for describing the relationship between the subject and the parallax pixels in the phase shift arrangement.

On the other hand, in the phase shift arrangement, each repeating pattern 110 is formed by arranging the parallax pixels therein in a manner to receive subject light emitted from one small region and passed by some of the partial regions selected from the plurality of partial regions, but not all of the partial regions. FIG. 8 is a schematic view for describing the relationship between the subject and the parallax pixels in the phase shift arrangement. In the exemplary phase shift arrangement shown in FIG. 8, the subject light emitted from one small region and passed through the selected partial regions is received, and the partial regions selected for this small region are changed for the adjacent small region. There can be patterns in which the selected partial regions are fixed, but the following description relates to the example shown in FIG. 8.

In the arrangement of FIG. 7, subject light emitted from one small region and passed through all of the nine partial regions Pa to Pi is received by nine parallax pixels. In contrast, in the phase shift arrangement of FIG. 8, subject light emitted from one small region is received by three parallax pixels provided to receive light through three of the nine partial regions Pa to Pi. By selecting some of the partial regions in this way, the number of small regions can be increased to improve the resolution. In the example of FIG. 8, the resolution is increased by a factor of three by selecting three of the nine partial regions.

As a specific example of an arrangement, three parallax pixels that are not adjacent among the parallax pixels forming the repeating pattern 110 of FIG. 7 are made a set, and this corresponds to rearranging the parallax pixels. More specifically, the parallax pixels including the aperture portions 104a, d, and g form a set, the parallax pixels including the aperture portions 104b, e, and h form a set, and the parallax pixels including the aperture portions 104c, f, and i form a set, such that the relative positions of each set are different. In other words, the phases of the sets are shifted relative to each other. In the example in the drawings, as a result of the arrangement in which the phases are shifted, in the newly formed repeating pattern 110, the aperture portion 104g is arranged in the parallax pixel at the right edge, and the aperture portions e, c, a, h, f, d, and b are arranged in the stated order moving toward the left, until reaching the aperture portion 104i in the parallax pixel at the left edge. Each repeating pattern 110 forming the image capturing element 100 has the same arrangement Each of the parallax pixels included in the newly formed repeating pattern 110 receives subject light emitted from one of three small regions of the subject 30 at the focused position, instead of each parallax pixel receiving subject light from the same small region as occurs in the repeating pattern 110 of FIG. 7. For example, as shown in the enlarged portion of FIG. 8, each parallax pixel in the repeating pattern 110 near the image-side region $I_{p9}$ receives the subject light emitted from the small region $O_{p9}$, with three parallax pixels including the aperture portions 104c, f, and i. The parallax pixels including the aperture portions 104g, a, and d of the repeating pattern 110 receive subject light from a different small region, and the parallax pixels including the aperture portions 104e, h, and b of the repeating pattern 110 receive subject light from yet another different region.

Figure 9A:
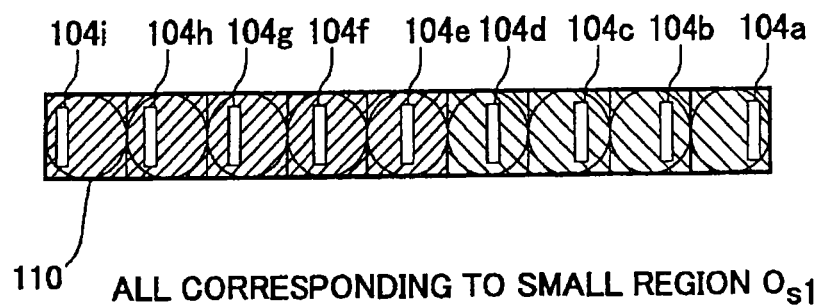
FIG. 9A shows a repeating pattern including nine pixels that corresponds to FIG. 7, and does not use the phase shift arrangement.
Figure 9B:
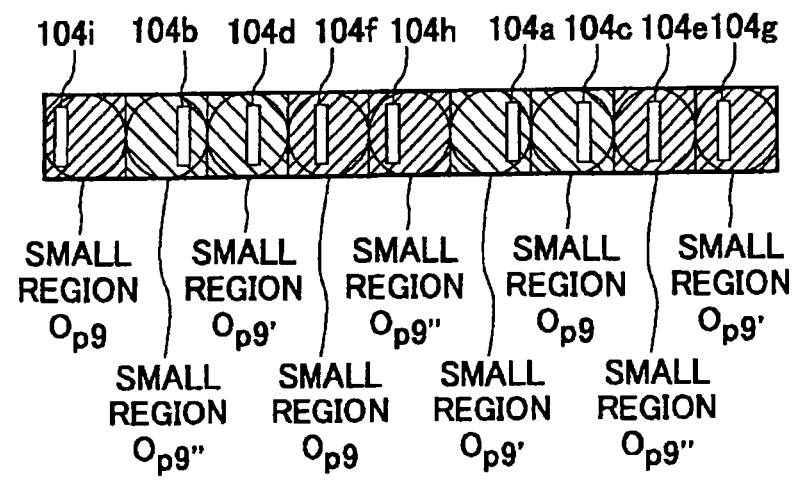
FIG. 9B shows a repeating pattern including nine pixels that corresponds to FIG. 8, and uses the phase shift arrangement.

FIGS. 9A and 9B are used to describe a repeating pattern. FIG. 9A shows a repeating pattern 110 including nine pixels that corresponds to FIG. 7, and does not use the phase shift arrangement. In this case, the parallax pixels forming the repeating pattern 110 all receive the light emitted from the small region $O_{s1}$.

FIG. 9B shows a repeating pattern 110 including nine pixels that corresponds to FIG. 8, and uses the phase shift arrangement. In this case, the nine parallax pixels forming the repeating pattern 110 can be defined as a photoelectric converting element group including aperture masks 103 having, in order from right to left, the aperture portions 104g, e, c, a, h, f, d, b, and i. In a pattern having the phase shift arrangement, the parallax pixels do not all receive subject light from the same small region, and therefore the division may be made between any pixel as long as nine adjacent pixels are formed as a set.

The above describes an example of using a repeating pattern 110 generated from parallax pixels having nine view points to form a repeating pattern 110 having a phase shift arrangement and three times the resolution of the original repeating pattern 110. The phase shift arrangement can have several different variations. By grouping the parallax pixels in a geometric arrangement, the repeating patterns 110 can be set in a large variety of states while considering the balance between the number of parallax pixels and the resolution.

In the example described above, as shown in FIG. 8, the small regions resulting from the repeating patterns 110 based on the phase shift arrangement are at uniform intervals. In other words, if the repeating patterns 110 are in series and adjacent, the small regions captured by the parallax pixels are at uniform intervals in at least a one-dimensional direction in a subject plane. When the small regions are at uniform intervals, there is no distortion in the acquired parallax images, and therefore parallax images that appear natural can be obtained.

In the example described above, the parallax pixels including the aperture portions 104a, d, and g, the parallax pixels including the aperture portions 104b, e, and h, the parallax pixels including the aperture portions 104c, f, and i of the repeating pattern 110 shown in FIG. 9A are respectively grouped as sets to form the repeating pattern 110 shown in FIG. 9B. In this case, the sets of parallax pixels are determined such that the small regions of the subject 30 at the focused position are at uniform intervals. In the example of FIG. 8, the small regions are at uniform intervals in the one-dimensional direction of the subject 30, which is the x-direction, but when the aperture portion 104s are to be displaced to create a parallax in the y-direction as well, as described further below, the sets of parallax pixels can be determined such that the small regions are at uniform intervals in two dimensions including the y-direction. In other words, when each selected set of parallax pixels is arranged with a phase shifted relative to the other sets, the small regions corresponding to the parallax pixels can be rearranged at uniform intervals in at least one of the x-direction and the y-direction. When a two-dimensional phase shift arrangement is used, the resolution is a constant value regardless of the subject regions, and therefore the small regions of the subject 30 at the focused position are preferably rearranged at uniform intervals. Furthermore, in consideration of the sight of a person observing the image, the small regions are preferably rearranged to have uniform intervals in at least the horizontal direction of the subject 30 at the focused position. Distortion of the image can be fixed using image processing, for example, and therefore repeating patterns 110 may be used in which the small regions are not at uniform intervals in order to prioritize other constraining conditions.

Figure 10:
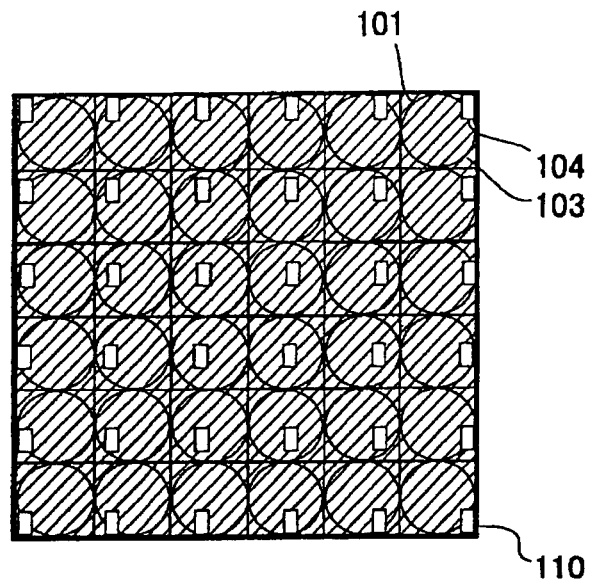
FIG. 10 shows an exemplary two-dimensional repeating pattern.

The above describes an example of generating parallax images with a parallax mainly in the horizontal direction, but it is obvious that parallax images having a parallax in the vertical direction or parallax images having a two-dimensional parallax in both the horizontal and vertical directions can be generated. FIG. 10 shows an exemplary two-dimensional repeating pattern 110.

The exemplary repeating pattern 110 of FIG. 10 includes, as a photoelectric converting element group, 36 pixels in a six by six arrangement. The position of the aperture portion 104 relative to each pixel is shifted in both the horizontal and vertical directions to be different for each pixel, thereby forming 36 types of aperture masks 103. Specifically, the aperture portions 104 are gradually shifted from top to bottom in a direction from the top edge of pixels to the bottom edge of pixels of the repeating pattern 110, and gradually shifted from left to right in a direction from the left edge of pixels to the right edge of pixels.

The image capturing element 100 including such a repeating pattern 110 can output parallax images with 36 view points having parallaxes in both the horizontal and vertical directions. It is obvious that the arrangement is not limited to the example of FIG. 10, and the repeating pattern 110 can be set to output parallax images with a variety of view points. In this case, the phase shift arrangement described above may be adopted in two dimensions.

In the above description, the aperture portions 104 are rectangles. In an arrangement for creating a horizontal parallax, the amount of light guided to the photoelectric converting elements 108 can be ensured by setting the width of the aperture portions 104 in the direction of the shifting, which is the horizontal direction in this case, to be less than the width in the direction in which there is no shifting, which is the vertical direction in this case. However, the aperture portions 104 are not limited to having a rectangular shape.

Figure 11:
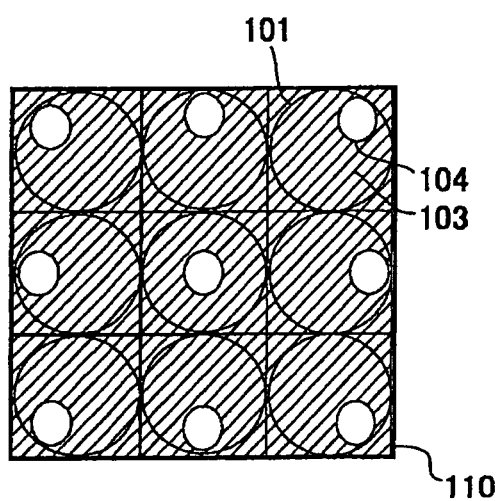
FIG. 11 shows an example of aperture portions having other shapes.

FIG. 11 shows an example of aperture portions 104 having other shapes. In FIG. 11, the aperture portions 104 are circular. When circular aperture portions 104 are used, unintended subject light can be prevented from becoming stray light and being incident to the photoelectric converting elements 108, due to the relationship with the semi-circular microlenses 101.

Figure 12:
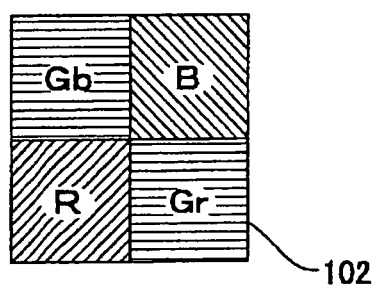
FIG. 12 is used to describe a Bayer arrangement

The following describes a parallax image for a color filter 102. FIG. 12 is used to describe a Bayer arrangement. As shown in FIG. 12, in the Bayer arrangement, green filters are allocated to the upper left and lower right pixels, a red filter is allocated to the lower left pixel, and a blue filter is allocated to the upper right pixel. Here, the upper left pixel to which a green filter is allocated is referred to as a Gb pixel, and the lower right pixel to which a green filter is allocated is referred to as a Gr pixel. The pixel to which the red filter is allocated is referred to as an R pixel, and the pixel to which the blue filter is allocated is referred to as a B pixel. The horizontal direction in which the Gb pixel and the B pixel are lined up is referred to as the Gb row, and the horizontal direction in which the R pixel and the Gr pixel are lined up is referred to as the Gr row. The vertical direction in which the Gb pixel and the R pixel are lined up is referred to as the Gb column, and the vertical direction in which the B pixel and the Gr pixel are lined up is referred to as the Gr column.

With this color filter 102 arrangement, a large number of repeating patterns 110 can be set by allocating parallax pixels and non-parallax pixels with various colors at various intervals. By gathering the outputs of non-parallax pixels, non-parallax image data can be generated in the same manner as a normal captured image. Accordingly, if the ratio of non-parallax pixels is increased, a 2D image with high resolution can be output. In this case, the ratio of parallax pixels is relatively low, and therefore the image quality as a 3D image formed by a plurality of parallax images is decreased. On the other hand, if the ratio of parallax pixels is increased, the image quality as a 3D image is increased, but the number of non-parallax pixels is decreased, and therefore a 2D image with low resolution is output.

With this tradeoff relationship, repeating patterns 110 can be set to have a variety of characteristics by determining which pixels are parallax pixels and which are non-parallax pixels. FIG. 13 describes variations for the allocation of parallax pixels in the Bayer arrangement in which there are two types of parallax pixels. In this case, it is assumed that the parallax pixels are a parallax L pixel that is centered to the left side of the center of the aperture portion 104 and a parallax R pixel that is centered to the right side of the center of the aperture portion 104. In other words, the parallax image with two view points output from these parallax pixels has a so-called stereoscopic appearance.

The characteristics for each repeating pattern are as described in FIG. 13. For example, 2D image data with high resolution is obtained when a large number of non-parallax pixels are allocated, and 2D image data with high image quality and low color drift is obtained when the non-parallax pixels are allocated uniformly among the red, green, and blue pixels. When the output of parallax pixels is also used to generate 2D image data, the output of the peripheral pixels is referenced to correct the skewed subject image. Accordingly, a 2D image can be generated even if all of the R pixels are parallax pixels, for example, but the quality of this image would be lowered.

On the other hand, 3D image data with high resolution is obtained when a greater number of parallax pixels are allocated, and if the parallax pixels are allocated uniformly among the red, green, and blue pixels, color image data of a 3D image with high quality and good color reproducibility is obtained. If the output of non-parallax pixels is also used to generate the 3D image data, a skewed subject image is generated from the subject image without a parallax by referencing the output of the parallax pixels at the periphery. Accordingly, a color 3D image can be generated even if all of the R pixels are non-parallax pixels, for example, but the quality of the image would be lowered.

Figure 14:
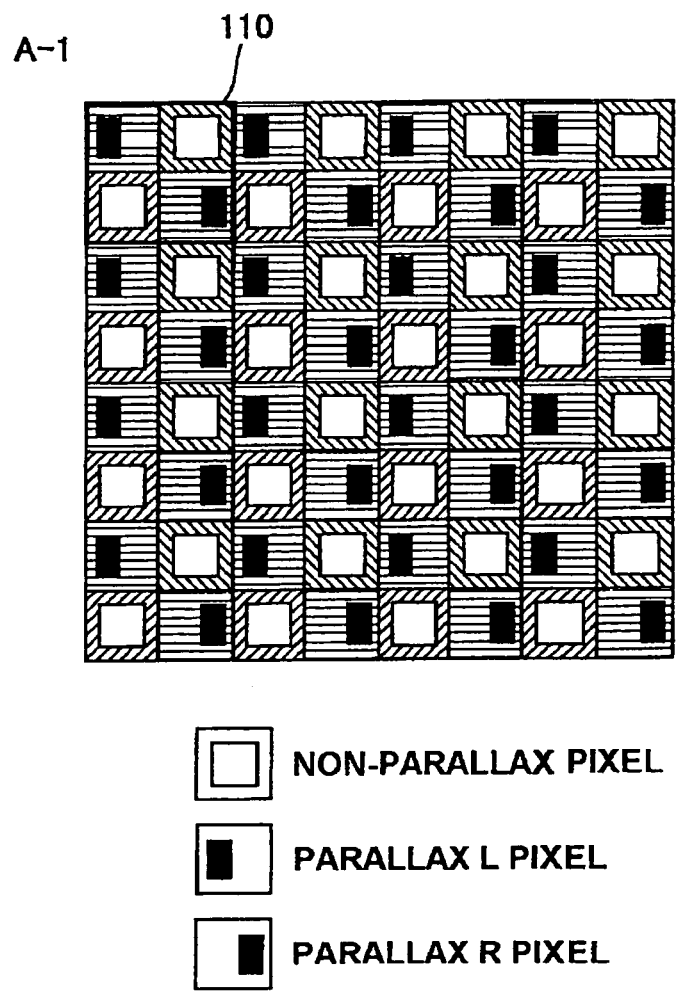
FIG. 14 shows an exemplary variation.

The following describes several variations. FIG. 14 shows an exemplary variation. The variation shown in FIG. 14 corresponds to the repeating pattern type A-1 shown in FIG. 13.

In the example of FIG. 14, each repeating pattern 110 is formed by the same four pixels as used in the Bayer arrangement. The R pixels and G pixels are non-parallax pixels, the Gb pixels are allocated to the parallax L pixels, and the Gr pixels are allocated to the parallax R pixels. In this case, the aperture portions 104 can be determined such that the parallax L pixel and the parallax R pixel included in each repeating pattern 110 receive light emitted from the same small region when the subject is at the focused position, or can be arranged such that these pixels receive light emitted from different small regions when the subject is at the focused position. If the aperture portions 104 are arranged such that these pixels receive light emitted from different small regions, the phase shift arrangement may be such that, in two horizontally adjacent repeating patterns 110, for example, the parallax L pixel allocated to the Gb pixel of the repeating pattern 110 on the left and the parallax R pixel allocated to the Gr pixel of the repeating pattern 110 on the right receive light emitted from the same small region.

In the example of FIG. 14, the Gb pixels and Gr pixels, which are green pixels having high visual sensitivity, are used as the parallax pixels, and therefore the acquired image is expected to have high contrast. Furthermore, since the Gb pixels and the Gr pixels used as the parallax pixels are the same color, the computation for converting the output of the two pixels into an output without a parallax is simple, and together with the output of the R pixels and B pixels, which are the non-parallax pixels, 2D image data with high quality can be generated.

Figure 15:
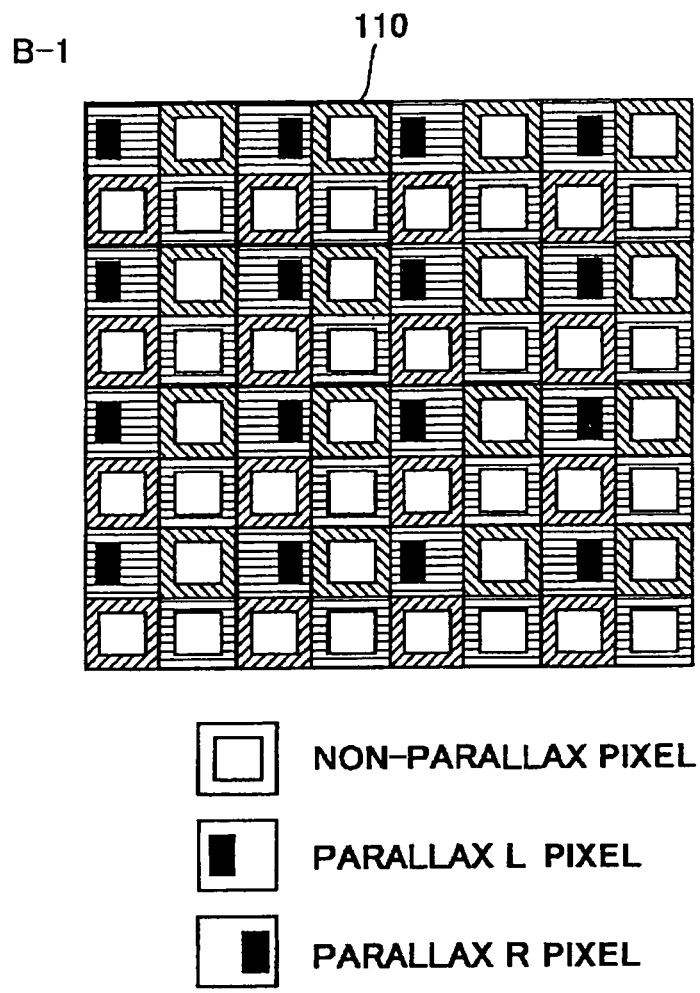
FIG. 15 shows another exemplary variation.

FIG. 15 shows another exemplary variation. The variation shown in FIG. 15 corresponds to the B-1 type of repeating pattern of FIG. 13.

In the example of FIG. 15, the repeating pattern 110 is formed by eight pixels resulting from two sets of the four-pixel Bayer arrangement being placed adjacently. Among these eight pixels, the parallax L pixel is allocated to the Gb pixel on the left side and the parallax R pixel is allocated to the Gb pixel on the right side. With this arrangement, the quality of a 2D image can be increased beyond that of the example shown in FIG. 13, by setting the Gr pixels to be non-parallax pixels.

Figure 16:
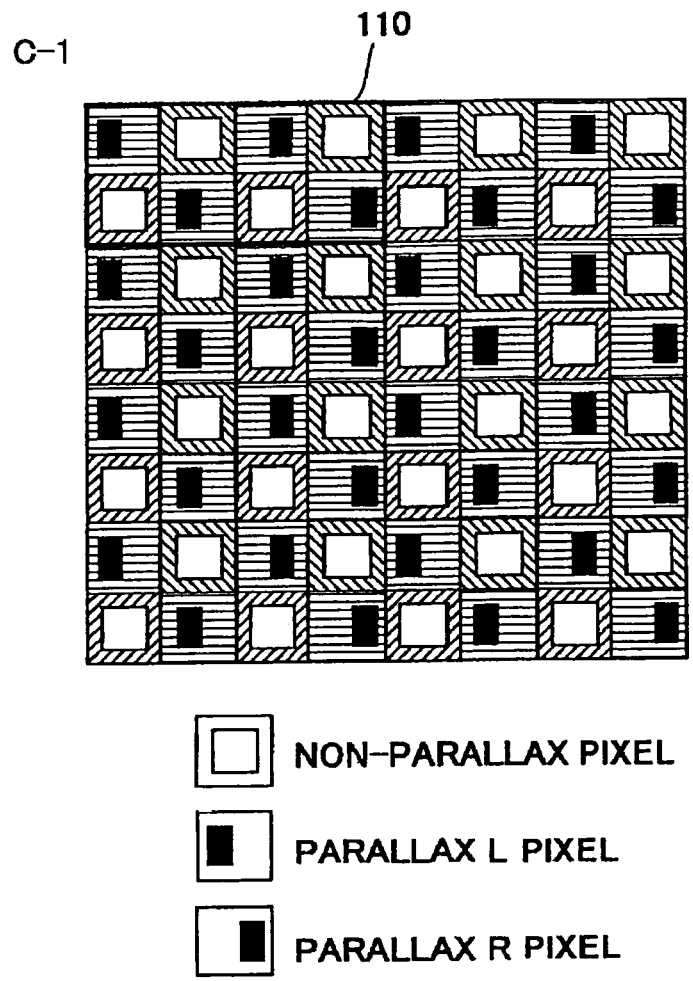
FIG. 16 shows another exemplary variation.

FIG. 16 shows another exemplary variation. The variation shown in FIG. 16 corresponds to the C-1 type of repeating pattern of FIG. 13.

In the example of FIG. 16, the repeating pattern 110 is formed by eight pixels resulting from two sets of the four-pixel Bayer arrangement being placed adjacently. Among these eight pixels, a parallax L pixel is allocated to the Gb pixel on the left side and a parallax R pixel is allocated to the Gb pixel on the right side. Furthermore, a parallax L pixel is also allocated to the Gr pixel on the left side, and a parallax R pixel is also allocated to the Gr pixel on the right side. When the subject is at the focused position, the parallax L pixel and parallax R pixel allocated to the two Gb pixels receive light emitted from one small region, and the parallax L pixel and parallax R pixel allocated to the two Gr pixels receive light emitted from a small region that is different from the small region corresponding to the Gb pixels. Accordingly, compared to the example of FIG. 15, the example of FIG. 16 can obtain a 3D image with twice the vertical resolution.

Figure 17:
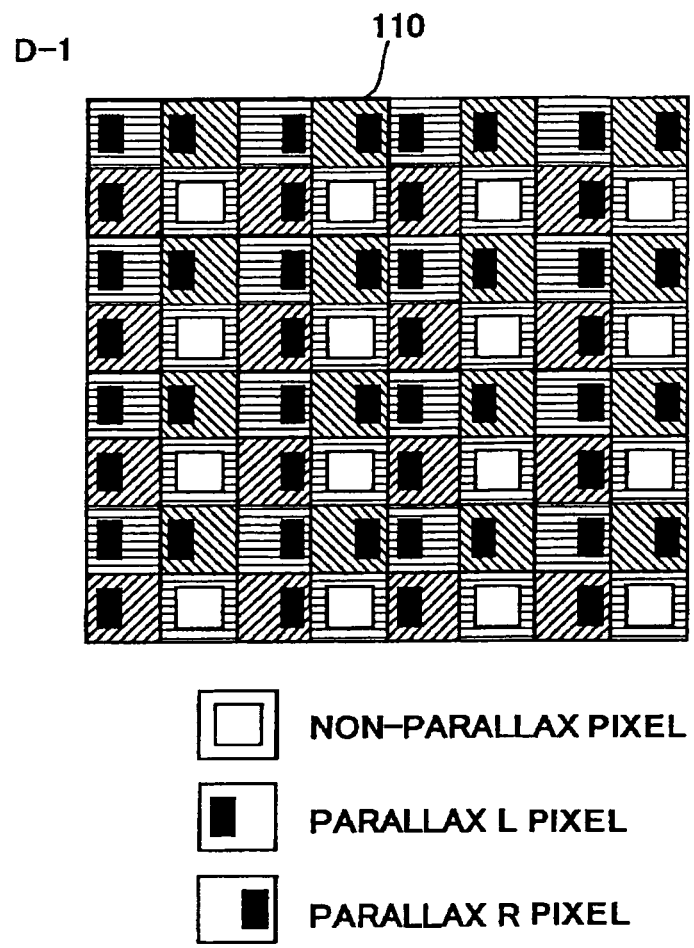
FIG. 17 shows another exemplary variation.

FIG. 17 shows yet another exemplary variation. The variation shown in FIG. 17 corresponds to the D-1 type of repeating pattern of FIG. 13.

In the example of FIG. 17, the repeating pattern 110 is formed by eight pixels resulting from two sets of the four-pixel Bayer arrangement being placed adjacently. Among these eight pixels, a parallax L pixel is allocated to the Gb pixel on the left side and a parallax R pixel is allocated to the Gb pixel on the right side. Furthermore, a parallax L pixel is allocated to the R pixel on the left side, and a parallax R pixel is allocated to the R pixel on the right side. Yet further, a parallax L pixel is allocated to the B pixel on the left side, and a parallax R pixel is allocated to the B pixel on the right side. Non-parallax pixels are allocated to the two Gr pixels.

The parallax L pixel and parallax R pixel allocated to the two Gb pixels receive light emitted from one small region when the subject is at the focused position. The parallax L pixel and the parallax R pixel allocated to the two R pixels receive light emitted from one small region that is different from the small region corresponding to the Gb pixels, and the parallax L pixel and the parallax R pixel allocated to the two B pixels receive light emitted from one small region that is different from the small region corresponding to the Gb pixels and the small region corresponding to the R pixels. Accordingly, compared to the example of FIG. 15, the example of FIG. 17 can obtain a 3D image with three times the vertical resolution. Furthermore, since the output is obtained in the three colors red, green, and blue, the resulting image is a high-quality 3D color image.

FIG. 18 describes allocation of parallax pixels in a Bayer arrangement for variations in which there are three types of parallax pixels. In this case, the parallax pixels are set to be parallax L pixels centered on the left side of the corresponding aperture portions 104, parallax C pixels centered in the center of the corresponding aperture portions 104, and parallax R pixels centered on the right side of the corresponding aperture portions 104. Each parallax C pixel, which is not displaced from the center, outputs a parallax image by guiding to the photoelectric converting element 108 only the subject light from a central partial region of the lens, and differs from a non-parallax pixel that does not limit the subject light input to the photoelectric converting element 108. Accordingly, parallax images with three view points are output by these three types of parallax pixels.

Each repeating pattern has the characteristics described in FIG. 18. The tradeoff relationship for a 2D image with two points of view and a 3D image is the same in the case of three view points.

Figure 19:
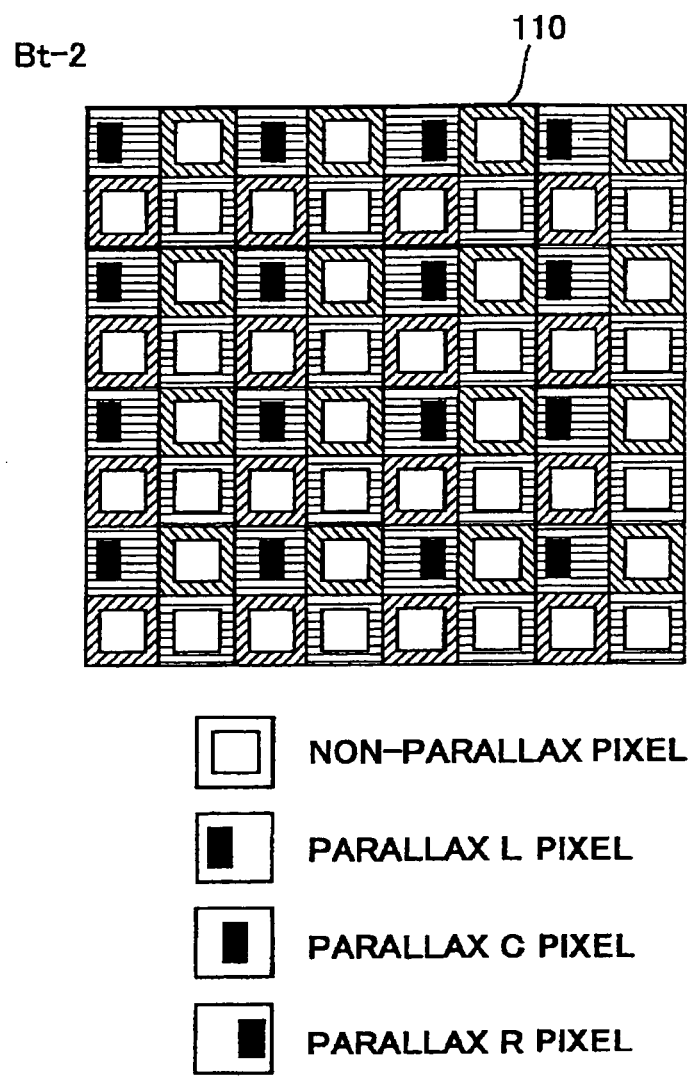
FIG. 19 shows an exemplary variation.

The following describes an exemplary variation with three view points. FIG. 19 shows a variation that corresponds to the Bt-2 type of repeating pattern of FIG. 18.

In the example of FIG. 19, the repeating pattern 110 is formed by twelve pixels resulting from three sets of four-pixel Bayer arrangements being arranged horizontally in series. Among these twelve pixels, a parallax L pixel, a parallax C pixel, and a parallax R pixel are respectively allocated to the three Gb pixels from left to right. Non-parallax pixels are allocated to all of the other pixels.

With the repeating pattern 110 described above, a parallax image with three view points can be acquired while maintaining high color quality and resolution equal to that of a 2D image.

FIG. 20 describes exemplary variations for allocating parallax pixels in a Bayer arrangement when there are four or more types of parallax pixels. In this way, even if the number of view points is increased, a variety of repeating patterns 110 can be formed. Accordingly, a repeating pattern 110 can be selected according to certain specifications, intended use, or the like.

In the examples described above, the Bayer arrangement is adopted for the color filter arrangement, but it is obvious that other color filter arrangements can be used without problems. As described with reference to FIG. 3 and other drawings, when the pixels are gathered while focusing on a single color in the color filter arrangement, each repeating pattern may be formed as a photoelectric converting element group including a set of adjacent pixels, and the parallax pixels may be allocated in a manner to output parallax images. At this time, each parallax pixel forming the photoelectric converting element group may include an aperture mask 103 having an aperture portion 104 oriented toward a different partial region.

Figure 21:
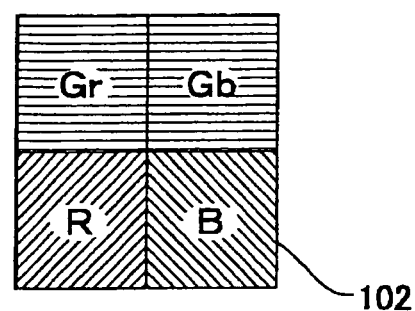
FIG. 21 is used to describe another color filter arrangement.

FIG. 21 is used to describe another color filter arrangement. As shown in FIG. 21, in the other color filter arrangement, green filters are allocated to the upper left and lower right pixels, a red filter is allocated to the bottom left pixel, and a blue filter is allocated to the lower right pixel. Here, the upper left pixel to which a green filter is allocated is referred to as the Gr pixel, and the upper right pixel to which a green filter is allocated is referred to as the Gb pixel. Furthermore, the pixel to which a red filter is allocated is referred to as the R pixel, and the pixel to which a blue filter is allocated is referred to as the B pixel. The horizontal direction in which the Gr pixel and the Gb pixel are lined up is referred to as the G row, and the horizontal direction in which the R pixel and the B pixel are lined up is referred to as the RB row. The vertical direction in which the Gr pixel and the R pixel are lined up is referred to as the Gr column, and the vertical direction in which the Gb pixel and the B pixel are lined up is referred to as the Gb column.

In the same manner as when a Bayer arrangement is used, using this color filter arrangement enables a large number of repeating patterns 110 to be set by changing the colors and periodic allocation of the parallax pixels and non-parallax pixels. The relationship of outputting a 2D image with high resolution by increasing the ratio of non-parallax pixels and improving the quality of a 3D image by increasing the ratio of the parallax pixels is the same as in the above examples.

FIG. 22 describes exemplary variations for allocating parallax pixels in another color filter arrangement when there are two types of parallax pixels. The characteristics of each repeating pattern are as shown in FIG. 22. For example, 2D image data with high resolution is obtained when a greater number of non-parallax pixels are allocated, and 2D image data with high quality and little color drift is obtained when the non-parallax pixels are allocated uniformly among the red, green, and blue pixels. When also using the output of the parallax pixels to generate the 2D image data, the output of the peripheral pixels is referenced to correct the skewed subject image. Accordingly, a 2D image can be generated even if the all of the R pixels are parallax pixels, for example, but the quality of this image would be lowered.

On the other hand, 3D image data with high resolution is obtained when a greater number of parallax pixels are allocated, and if the parallax pixels are allocated uniformly among the red, green, and blue pixels, color image data of a 3D image with high quality and good color reproducibility is obtained. If the output of non-parallax pixels is also used to generate the 3D image data, a skewed subject image is generated from the subject image without a parallax by referencing the output of the parallax pixels at the periphery. Accordingly, a color 3D image can be generated even if all of the R pixels are non-parallax pixels, for example, but the quality of the image would be lowered.

FIG. 23 describes exemplary variations for allocating parallax pixels in another color filter arrangement when there are three types of parallax pixels. In this case, the parallax pixels are set to be parallax L pixels centered on the left side of the corresponding aperture portions 104, parallax C pixels centered in the center of the corresponding aperture portions 104, and parallax R pixels centered on the right side of the corresponding aperture portions 104.

Each repeating pattern has the characteristics described in FIG. 23. The tradeoff relationship for a 2D image with two view points and a 3D image is the same in the case of three view points.

Although not shown in the drawings, even when there are four or more types of parallax pixels, a variety of repeating patterns 110 can be formed. Accordingly, a repeating pattern 110 can be selected according to certain specifications, intended use, or the like.

Figure 24:
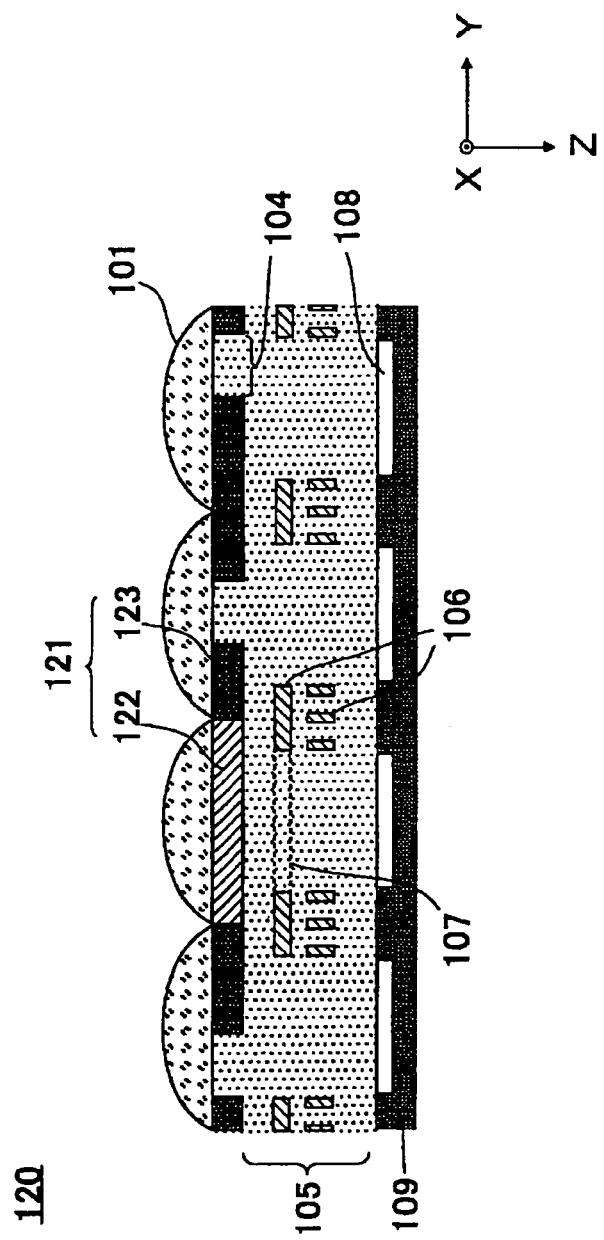
FIG. 24 is a schematic view of a cross section of another image capturing element according to an embodiment of the present invention.

FIG. 24 is a schematic view of a cross section of another image capturing element according to an embodiment of the present invention. FIG. 2 is a schematic cross-sectional view of an image capturing element 100 in which the color filters 102 and the aperture masks 103 are formed separately, but FIG. 24 is a schematic cross-sectional view of a modification of the image capturing element 100, which is an image capturing element 120 including a screen filter 121 in which color filter sections 122 and aperture mask sections 123 are formed integrally.

When pixels that acquire brightness information are set as the parallax pixels, i.e. when outputting monochromatic images as the parallax images, the configuration of the image capturing element 120 shown in FIG. 24 can be adopted. In other words, the screen filter 121 in which the color filter sections 122 functioning as the color filters and the aperture mask sections 123 including the aperture portions 104 are formed integrally can be arranged between the microlenses 101 and the wiring layer 105.

The screen filter 121 is formed by applying colors such as blue, green, and red to the color filter sections 122 and applying a black color to the mask portions of the aperture mask sections 123 but not to the aperture portions 104. In the image capturing element 120 using such a screen filter 121, the distance from the microlenses 101 to the photoelectric converting elements 108 is shorter than in the image capturing element 100, and therefore the collection efficiency of the subject light is higher.

Figure 25:
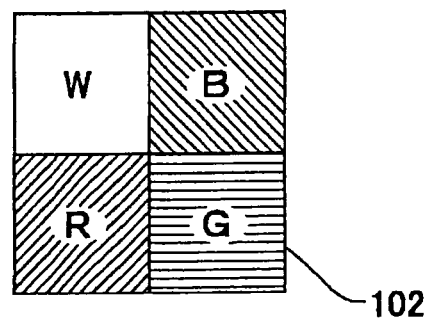
FIG. 25 is used to describe another color filter arrangement.

FIG. 25 is used to describe another color filter arrangement. As shown in FIG. 25, in this color filter arrangement, the Gr pixel in the Bayer arrangement shown in FIG. 12 remains as a G pixel to which is allocated a green filter, but the Gb pixel is change to a W pixel to which no color filter is allocated. The W pixel passes practically the entire wavelength band of visible light, as described above, and may have a transparent filter with no applied color arranged therein.

This color filter arrangement that includes the W pixel causes a small decrease in the accuracy of the color information output by the image capturing element 116, but the amount of light received by the W pixel is greater than the amount of light received by pixels having color filters, and therefore highly accurate brightness information can be obtained. A monochromatic image can be formed by gathering the output of the W pixels.

When the color filter arrangement including the W pixel is used, there are even more variations of repeating patterns 110 including parallax pixels and non-parallax pixels. For example, even if an image is captured in a relatively dark environment, the W pixels output a subject image with higher contrast than the image output from color pixels. Therefore, if parallax pixels are allocated to the W pixels, a highly accurate computational result can be expected in the matching process performed between a plurality of parallax images. The matching process is performed as part of the process for acquiring distance information for the subject image included in the image data. Accordingly, the repeating pattern 110 including parallax pixels and non-parallax pixels is set to affect the quality of the parallax image and the resolution of a 2D image, and in consideration of the advantages and disadvantages with respect to other extracted information.

Figure 26:
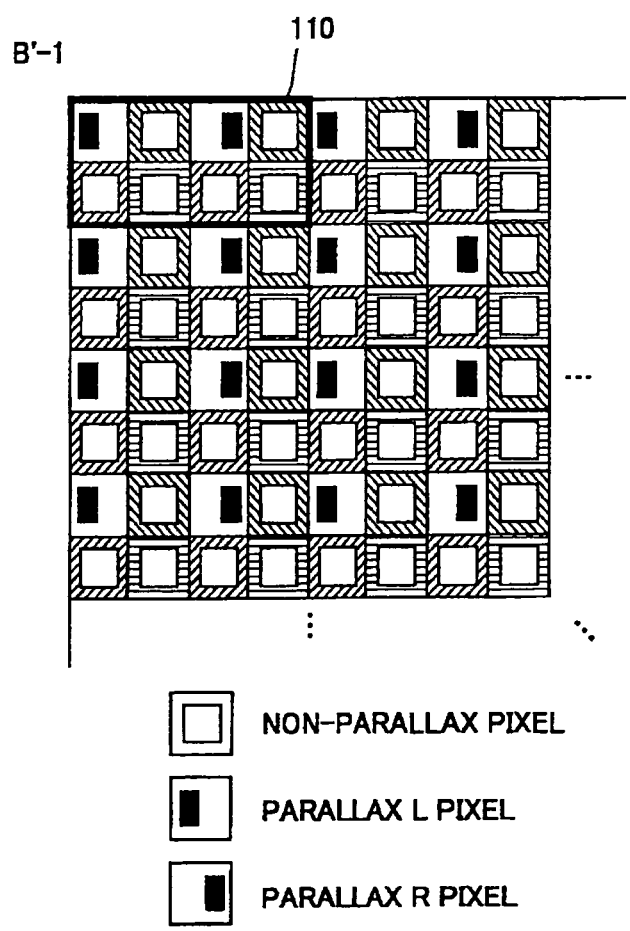
FIG. 26 shows an exemplary arrangement of W pixels and parallax pixels.

FIG. 26 shows an exemplary arrangement of W pixels and parallax pixels when the color filter arrangement of FIG. 25 is adopted. The variation shown in FIG. 26 resembles the type B-1 repeating pattern of FIG. 15 of the Bayer arrangement, and therefore this variation is labeled as B'-1. In this example, the repeating pattern 110 is formed by eight pixels resulting from two of the four-pixel color filter arrangements being arranged in series in the horizontal direction. Among these eight pixels, a parallax L pixel is allocated to the W pixel on the left side and a parallax R pixel is allocated to the W pixel on the right side. With this arrangement, the image capturing element 100 outputs a monochromatic image as the parallax image, and outputs a color image as the 2D image.

In this case, the image capturing element 100 includes photoelectric converting elements 108 that are arranged two-dimensionally and convert incident light into an electrical signal, aperture masks corresponding one-to-one with at least a portion of the photoelectric converting elements 108, and color filters 102 corresponding one-to-one with at least a portion of the photoelectric converting elements 108. Among n adjacent photoelectric converting elements 108, where n is an integer greater than or equal to 4, the aperture portions 104 of the aperture masks 103 corresponding to at least two of the photoelectric converting elements 108 are not included in the pattern of the color filter pattern formed from at least two types of color filters 102 that pass different wavelength bands and are positioned to respectively pass light from different partial regions within a cross-sectional region of the incident light, and the photoelectric converting element groups each including n photoelectric converting elements 108 are arranged periodically in series.

The following describes generation of a parallax image as a monochromatic image and generation of a 2D image as a color image.

FIG. 27 is a schematic view showing the process for generating a 2D image and a parallax image. As shown in FIG. 27, the outputs of the parallax L pixels are gathered while maintaining the positional relationship on the image capturing element 100, thereby generating L image data. There is one parallax L pixel included in each repeating pattern 110, and therefore each parallax L pixel used to generate the L image data is gathered from a different repeating pattern 110. In other words, the gathered outputs of the parallax L pixels are the result of a photoelectric conversion being performed on light emitted from different small regions of the subject, and therefore the L image data is one piece of parallax image data obtained by capturing the subject from a specified view point, i.e. the L view point. The parallax L pixels are allocated to W pixels, and therefore the L image data is generated as a monochromatic image without color information.

In the same manner, the outputs of the parallax R pixels are gathered while maintaining the positional relationship on the image capturing element 100, thereby generating R image data. The gathered outputs of the parallax R pixels are the result of a photoelectric conversion being performed on light emitted from different small regions of the subject, and therefore the R image data is one piece of parallax image data obtained by capturing the subject from a specified view point, i.e. the R view point. The parallax R pixels are allocated to W pixels, and therefore the R image data is generated as a monochromatic image without color information.

When the subject is at the focused position, the L pixel and R pixel in each repeating pattern 110 receive light emitted from the same small region of the subject. Furthermore, when the subject is at an unfocused position, the L pixel and R pixel in each repeating pattern 110 receive light emitted from small regions of the subject that are skewed from each other. The direction and amount of this skew are determined by the relative position of the subject with respect to the focused position and with respect to the partial regions of the lens eye. Accordingly, the L image data and the R image data each form a parallax image as a result of respectively gathering the parallax L pixels and parallax R pixels together while maintaining the relative positions on the image capturing element 100.

The 2D image data is generated by gathering together the outputs of the non-parallax pixels, while maintaining the relative positions on the image capturing element 100. At this time, the W pixels are parallax pixels, and therefore the output corresponding to the Gb pixels is reduced in comparison to the output from a Bayer arrangement formed by only non-parallax pixels. The output value of the G pixels can be substituted as the value by which the output is reduced. In other words, an interpolation process is performed using the output of the G pixels. By performing the interpolation in this way, 2D image data can be generated by applying image processing to the output of the Bayer arrangements.

The image processing described above is performed by the image processing section 205. The image processing section 205 receives an image signal output from the image capturing element 100 via the control section 201, and generates L image data, R image data, and 2D image data by, grouping the outputs of the various pixels in the manner described above.

In the embodiments described above, the image capturing element 100 is formed by arranging repeating patterns 110 that each include a group of photoelectric converting elements periodically and in series. However, it is only necessary that the parallax pixels having color filters respectively capture discrete small regions of the subject to output parallax images, and therefore non-parallax pixels may be allocated continuously between repeating patterns 110 arranged periodically, for example. In other words, the repeating patterns 110 including parallax pixels need not be continuous, and can still output parallax images when arranged periodically. In the present embodiment, the microlenses 101 correspond one-to-one with the photoelectric converting elements 108, but instead, one microlens 101 may be provided for each set of a plurality of photoelectric converting elements 108. In this case, one microlens 101 may be provided for each repeating pattern 110 including a group of photoelectric converting elements, or the microlenses may be provided in a manner unrelated to the repeating patterns 110.

Figure 28:
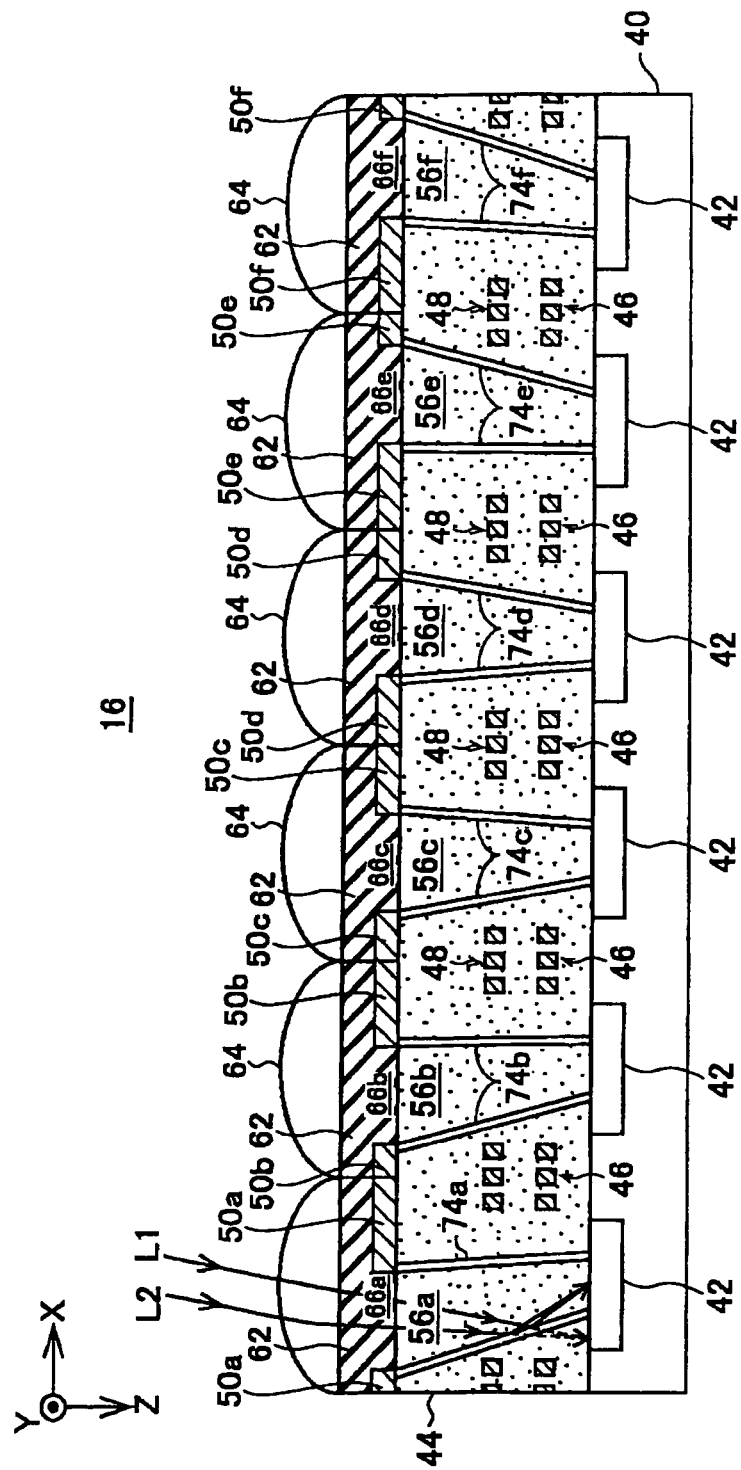
FIG. 28 is a vertical cross-sectional view of an image capturing element.

The following describes another embodiment in which the image capturing element has a different configuration. FIG. 28 is a vertical cross-sectional view of an image capturing element. As shown in FIG. 28, the image capturing element 16 includes a substrate 40, photoelectric converting elements 42, an insulating layer 44, a wiring layer 46, a wiring layer 48, aperture masks 50a to 50f, waveguides 56a to 56f, color filters 62, and microlenses 64. The wiring layer 46 is an example of a first metal layer. The wiring layer 48 is an example of a second metal layer. The aperture masks 50a to 50f are an example of a third metal layer. In the example of FIG. 28, six types of waveguides 56a to 56f are shown corresponding to six types of aperture masks 50a to 50f.

The substrate 40 is formed by a semiconductor material such as silicon or GaAs, or by an insulating material such as sapphire.

The photoelectric converting elements 42 each output an electrical signal corresponding to the received light. The photoelectric converting elements 42 are arranged on the top surface of the substrate 40. Photodiodes, for example, can be used as the photoelectric converting elements 42. The photoelectric converting elements 42 are arranged two-dimensionally with prescribed intervals therebetween in the X-direction and the Y-direction.

The insulating layer 44 insulates the photoelectric converting elements 42, the wiring layer 46, and the wiring layer 48 from each other. The insulating layer 44 is formed to cover the substrate 40 and the photoelectric converting elements 42. The insulating layer 44 is made of an insulating material such as silicon oxide or silicon nitride.

The wiring layer 46 and the wiring layer 48 are embedded in the insulating layer 44. The wiring layer 48 is layered above the wiring layer 46, with a prescribed space maintained therebetween. The wiring layer 46 and the wiring layer 48 are formed of a conductive material such as metal. The wiring layer 46 and the wiring layer 48 transmit the electrical signals output from the photoelectric converting elements 42.

The aperture masks 50a to 50f are layered above the wiring layer 46 with a prescribed space maintained therebetween. The aperture masks 50a to 50f are arranged on the insulating layer 44. As a result, the wiring layer 46, the wiring layer 48, and the aperture masks 50a to 50f are layered in the stated order from the photoelectric converting element 42 side through the insulating layer 44. The aperture masks 50a to 50f are made of material that can block visible light, such as metal. The aperture masks 50a to 50f correspond one-to-one with the photoelectric converting elements 42. Apertures 66a to 66f are formed respectively in the aperture masks 50a to 50f. Features of the apertures 66a to 66f such as positioning will be described further below.

The waveguides 56a to 56f are formed within the insulating layer 44. The end of the waveguides 56a to 56f to which light is incident extend respectively from the aperture masks 50a to 50f. The other ends of the waveguides 56a to 56f extend to the photoelectric converting elements 42. As a result, the waveguides 56a to 56f respectively connect the corresponding apertures 66a to 66f to the corresponding photoelectric converting elements 42. The structure and function of the waveguides 56a to 56f are described further below.

The color filters 62 are made of methacrylate ester, for example. The color filters 62 are formed on the aperture masks 50a to 50f and on the insulating layer 44 exposed through the apertures 66a to 66f. The color filters 62 correspond one-to-one with the photoelectric converting elements 42. Each color filter 62 is colored to pass light of a specified wavelength band to the corresponding photoelectric converting element 42. In order to capture a color image, at least two different types of color filters 62 are provided. In order to capture a color image with higher image quality, it is necessary to provide three or more types of color filters 62. One exemplary combination of color filters 62 includes red filters that pass light in the red wavelength band, green filters that pass light in the green wavelength band, and blue filters that pass light in the blue wavelength band. One color filter pattern can be formed by arranging this combination of color filters 62 periodically. If a black and white image signal is to be output, the color filters 62 may be omitted.

The microlenses 64 are formed on the color filters 62. The microlenses 64 are converging lenses for guiding a greater amount of incident subject light to the photoelectric converting elements 42. The microlenses 64 correspond one-to-one with the photoelectric converting elements 42. The optical axes 21 of the microlenses 64 are preferably shifted to guide more subject light to the photoelectric converting elements 42, based on the relative positions of the photoelectric converting elements 42 with respect to the central eye of the image capturing lens 20. If the image capturing element 16 has good gathering efficiency and photoelectric conversion efficiency, the microlenses 64 may be omitted.

Each photoelectric converting element 42 together with the corresponding one of the aperture masks 50a to 50f, waveguides 56a to 56f, color filters 62, and microlenses 64 is referred to in a unit as a pixel. Furthermore, each pixel that includes one of the aperture masks 50a to 50f in which the aperture 66a to 66f causes a parallax is referred to as a "parallax pixel," and each pixel that includes an aperture mask in which the aperture does not cause a parallax is referred to as a "non-parallax pixel." If the effective pixel area of the image capturing element 16 is 24 mm by 16 mm, for example, the image capturing element 16 may include approximately 12 million pixels.

In the image capturing element 16, when the subject light is incident along the optical axis 21 of the image capturing lens 20, this light converges due to the microlenses 64 and is then incident to the color filters 62. Only a specified wavelength band of the light is selectively passed by each of the color filters 62. After this, the light incident from a prescribed direction passes through the apertures 66a to 66f of the aperture masks 50a to 50f. The light is reflected by outer wall portions 74a to 74f of the waveguides 56a to 56f, and becomes incident to the photoelectric converting elements 42 as eye-split light to be converted into an electrical signal.

Figure 29:
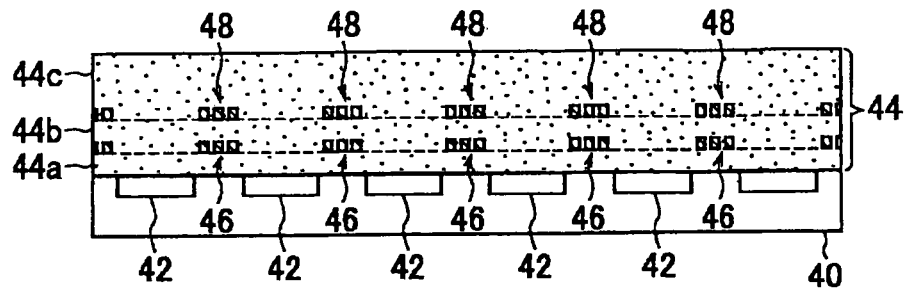
FIG. 29 is a view for describing the method of manufacturing the image capturing element
Figure 30:
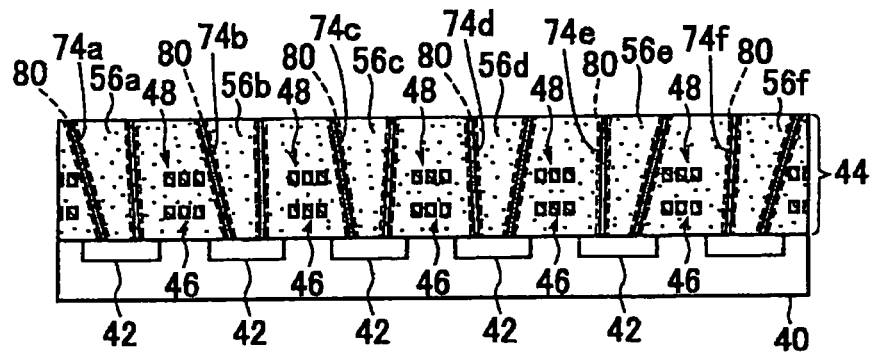
FIG. 30 is a view for describing the method of manufacturing the image capturing element
Figure 31:
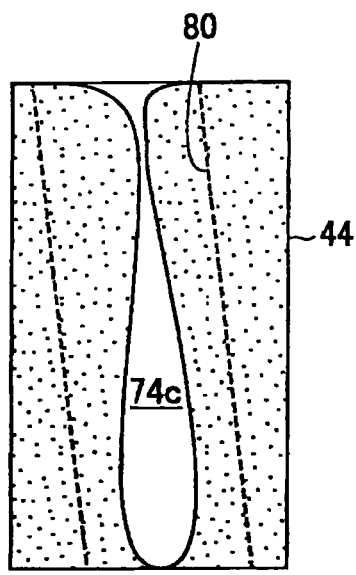
FIG. 31 is an enlarged view of the region near the groove in FIG. 30.

FIGS. 29 to 33 are used to describe a method of manufacturing an image capturing element. FIG. 31 is an enlarged view of the groove portion of FIG. 30. As shown in FIG. 29, the photoelectric converting elements 42 are formed on the substrate 40. Next, the insulating layer 44a is formed over the entire top surface of the substrate 40 and the photoelectric converting elements 42 using spin coating, for example, until the bottom layer of the wiring layer 46. The wiring layer 46 patterned using the lift off technique, for example, is formed on the top surface of the insulating layer 44a. The insulating layer 44 is formed over the entire top surface of the wiring layer 46 and the insulating layer 44a using spin coating, for example. The wiring layer 48 patterned using the lift off technique, for example, is formed on the top surface of the insulating layer 44b. Next, the insulating layer 44c is formed over the entire top surface of the wiring layer 48 and the insulating layer 44b using spin coating, for example. The insulating layers 44a, 44b, and 44c form the insulating layer 44.

Next, as shown in FIG. 30, anisotropic etching, such as dry etching, is used to form grooves 80 by removing the insulating layer 44 in a region corresponding to the outer wall portions 74a to 74f of the waveguides 56a to 56f. The grooves 80 are thicker than the outer wall portions 74 in a radial direction of the waveguides 56. After the grooves 80 are formed, an insulating material is embedded in the grooves 80 obtained by removing the insulating layer 44, as shown in FIG. 31. As a result, air remains in the embedded insulating material, thereby forming the outer wall portions 74a to 74f filled with air, as shown in FIG. 30.

Figure 32:
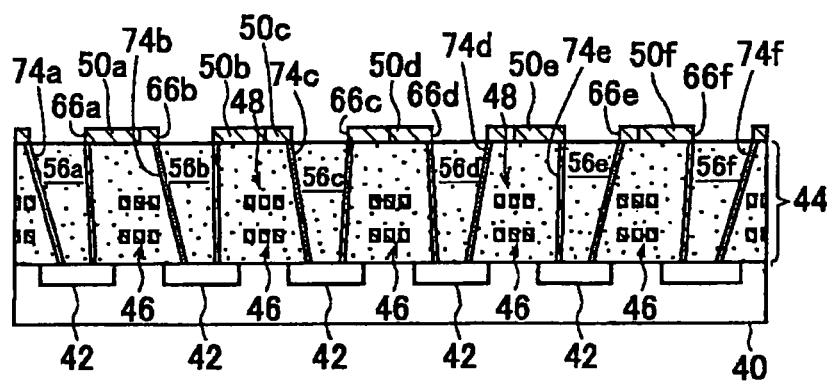
FIG. 32 is a view for describing the method of manufacturing the image capturing element.

Next, as shown in FIG. 32, the lift off technique is used to form the patterned aperture masks 50a to 50f on the insulating layer 44. The apertures 66a to 66f of the aperture masks 50a to 50f are formed to match the size and position of the top ends of the waveguides 56a to 56f.

Figure 33:
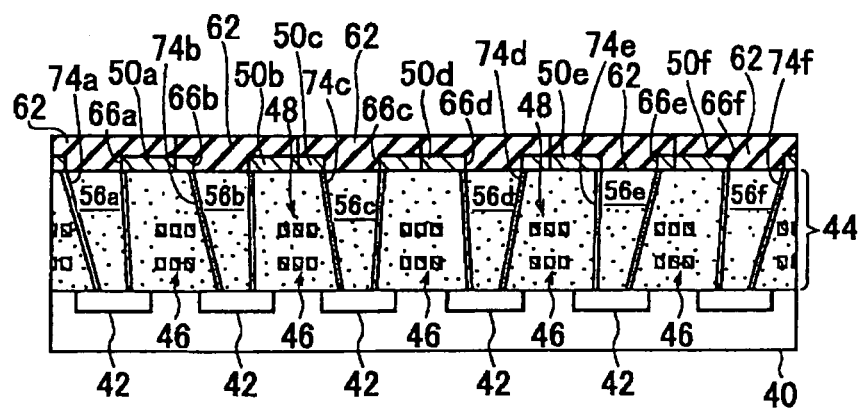
FIG. 33 is a view for describing the method of manufacturing the image capturing element.

As shown in FIG. 33, the color filters 62 are formed on the top surfaces of the aperture masks 50a to 50f. The color filters 62 are formed by coating the top surfaces of the aperture masks 50a to 50f with a material and then exposing each region to the corresponding color. After this, the microlenses 64 are formed on the top surface of the color filters 62, thereby completing the image capturing element 16 shown in FIG. 28.

The following describes the function and configuration of the waveguides 56, using FIG. 28. As described above, the apertures at the −Z ends of the waveguides 56a to 56f are formed with substantially the same size and at substantially the same position as the apertures 66a to 66f of the aperture masks 50a to 50f. The center of the bottom end of each of the waveguides 56a to 56f is aligned with the center of the corresponding photoelectric converting element 42.

The waveguides 56a to 56f respectively include the outer wall portions 74a to 74f. The outer wall portions 74 are formed to respectively surround the peripheries of the waveguides 56. The outer wall portions 74 are filled with air to function as air-gap layers. As a result, the refractive indices of the outer wall portions 74 differ from the refractive index of the insulating layer 44 around the waveguides 56. More specifically, the regions further inward than the outer wall portion 74a are filled with the insulating layer 44 having a different refractive index than air. If the insulating layer 44 is a silicon oxide layer, the insulating layer 44 has a higher refractive index than the outer wall portions 74 filled with air. The outer wall portions 74a to 74f may be formed as metal reflective layers of tungsten, aluminum, or copper, for example.

The angles of inclination of the outer wall portions 74a to 74f of the waveguides 56a to 56f are preferably set such that the light passed through the corresponding aperture masks 50 is reflected by the outer wall portions 74 to arrive near the highly-sensitive centers of the photoelectric converting elements 42. Using the pixel at the left edge in FIG. 28 as an example, for a light ray L1 from a direction in which the aperture 66a of the aperture mask 50a views the partial region Pf of FIG. 4A, if the outer wall portion 74a is not provided, there is a concern that the light ray L1 will be incident to a peripheral portion of the photoelectric converting element 42, which has low sensitivity, or will be skewed from the photoelectric converting element 42 and become incident to an adjacent photoelectric converting element 42. In contrast, by setting the angle such that the light ray L1 is reflected to a region near the center of the corresponding photoelectric converting element 42, the light can be gathered more reliably. Furthermore, among the light rays from a direction for viewing the partial region Pt, the light ray L1 passing through the center of the microlens 64 and the light ray L2 passing through a region that is not at the center are focused by this microlens 64, and an angle is preferably set that causes the focal point to be reflected by the outer wall portion 74a to a region near the center of the corresponding photoelectric converting element 42.

The angle for each of the outer wall portions 74a to 74f may be determined such that the light reaches the central region of the corresponding photoelectric converting element 42 with one reflection, or may be set such that the light reaches the central region of the corresponding photoelectric converting element 42 with two or more reflections. Furthermore, if the refractive index of the medium within the waveguides 56a to 56f is greater than the refractive index of the outer wall portions 74a to 74f, the angle of the above reflection is preferably set to achieve complete reflection. As a result, the light can be input more efficiently to the pixels.

The image capturing element 16 according to the present embodiment described above can generate parallax images by including six types of aperture masks 50a to 50f. As a result, the image capturing element 16 can obtain parallax images without needing a plurality of apparatuses such as optical systems.

The image capturing element 16 includes the waveguides 56a to 56f, and can therefore efficiently guide light to the photoelectric converting element 42 by restricting leakage of the light passed through the apertures 66a to 66f. Furthermore, as a result of the waveguides 56a to 56f restricting leakage of the light, the light to be received by one photoelectric converting element 42 can be prevented from being received by an adjacent photoelectric converting element 42. As a result, a highly accurate stereoscopic image can be obtained from a plurality of parallax images. Yet further, by providing each repeating pattern 110 with the plurality of waveguides 56a to 56f, the different eye-split light can be input to each of the plurality of photoelectric converting elements 42. As a result, a more accurate stereoscopic image can be obtained.

Figure 34:
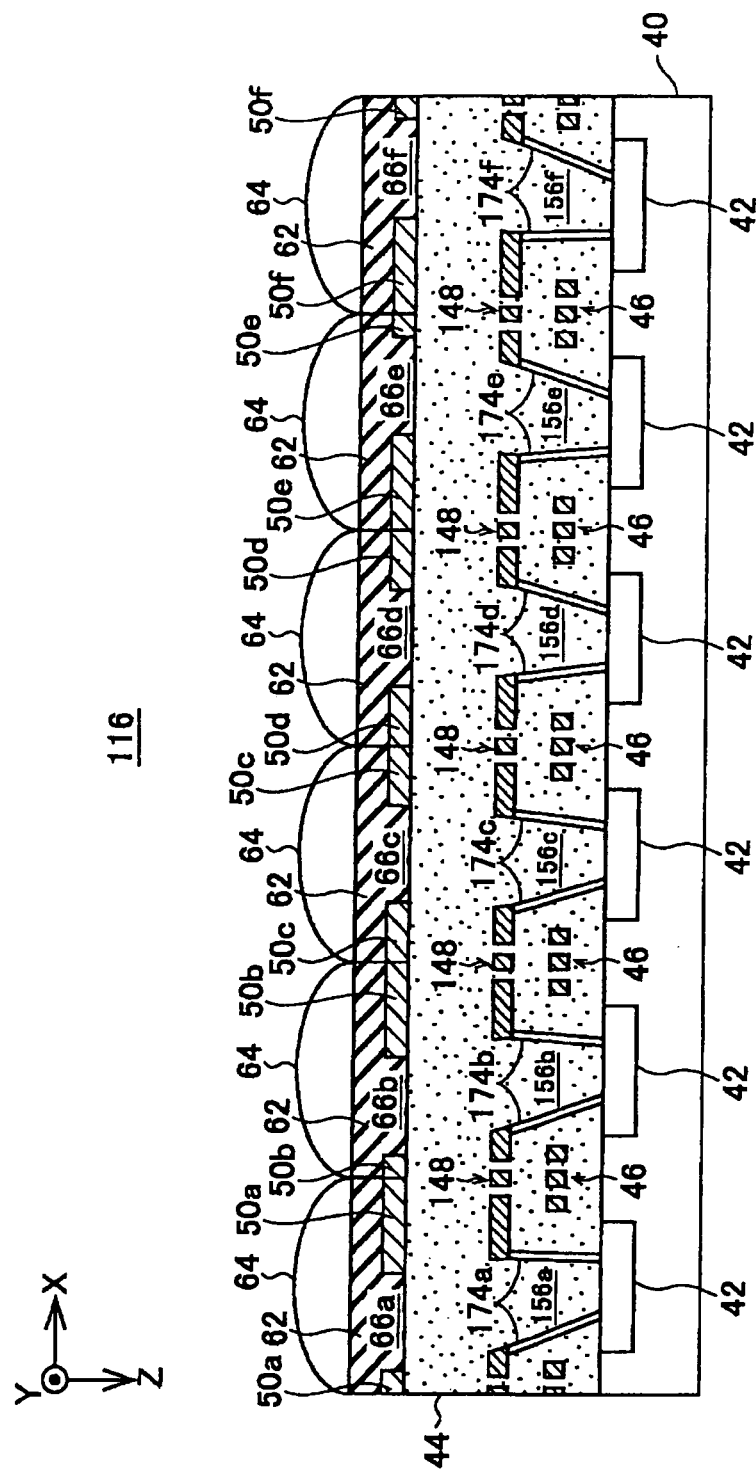
FIG. 34 is a vertical cross-sectional view of an image capturing element according to an embodiment in which the shape of waveguides is changed.

FIG. 34 is a vertical cross-sectional view of an image capturing element according to an embodiment in which the shape of the waveguides is changed. As shown in FIG. 34, the image capturing element 116 of the present embodiment includes waveguides 156a to 156f extending from the wiring layer 148 to the photoelectric converting elements 42. In this case, regions in the wiring layer 148 near the waveguides 156 extend to the outer wall portions 174 of the waveguides 156. The wiring layer 148 functions as a light blocking layer that blocks a portion of the incident light passed through the aperture masks 50. The wiring layer 148, which is a region functioning as a light blocking layer, may also function as a signal line, or may function only as a light blocking film. The angle of inclination of each of the outer wall portions 174a to 174f may be the same as the angle of inclination of the corresponding one of the outer wall portions 74a to 74f of FIG. 33.

Figure 35:
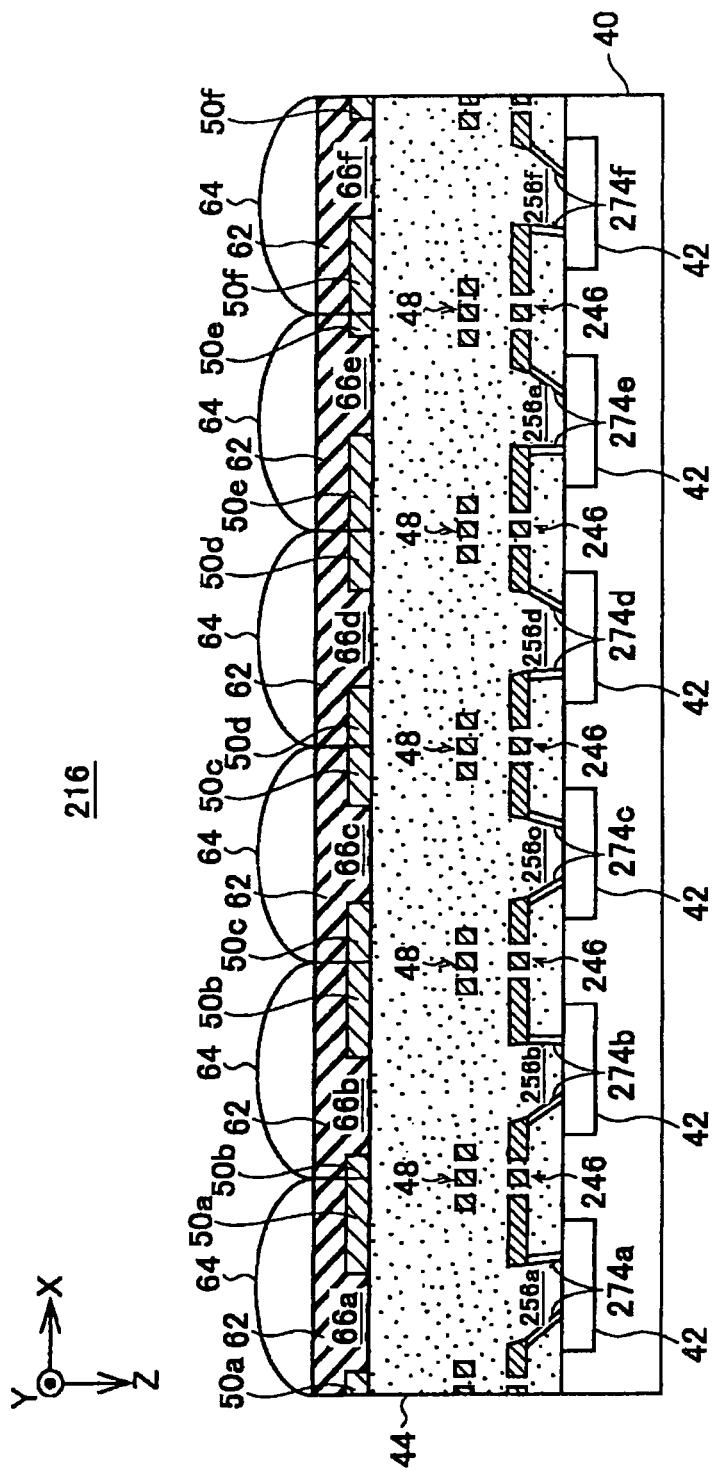
FIG. 35 is a vertical cross-sectional view of an image capturing element according to an embodiment in which the shape of the waveguides is changed.

FIG. 35 is a vertical cross-sectional view of an image capturing element according to an embodiment in which the shape of the waveguides is changed. As shown in FIG. 35, the image capturing element 216 of the present embodiment includes waveguides 256a to 256f extending from the wiring layer 246 to the photoelectric converting elements 42. In this case, regions of the wiring layer 246 near the waveguides 256 extend to the outer wall portions 274 of the waveguides 256. The wiring layer 246 functions as a light blocking layer that blocks a portion of the incident light passed through the aperture masks 50. The wiring layer 246, which is a region functioning as a light blocking layer, may also function as a signal line, or may function only as a light blocking film. The angle of inclination of each of the outer wall portions 274a to 274f may be the same as the angle of inclination of the corresponding one of the outer wall portions 74a to 74f of FIG. 33.

Figure 36:
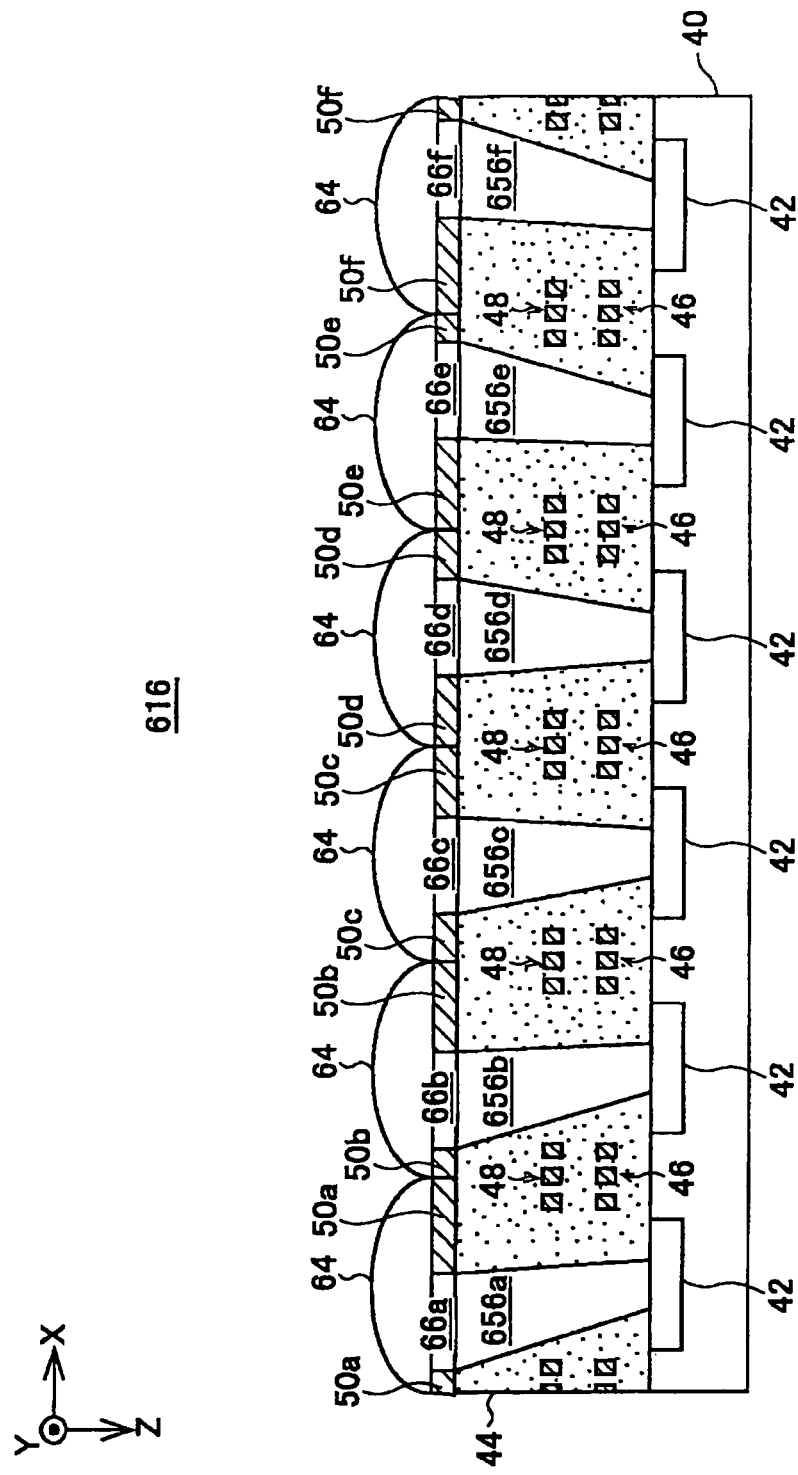
FIG. 36 is a vertical cross-sectional view of an image capturing element in which the waveguides are filled with air.

FIG. 36 is a vertical cross-sectional view of an image capturing element in which the waveguides are filled with air. As shown in FIG. 36, the image capturing element 616 of the present embodiment includes waveguides 656a to 656f filled with air. Therefore, the waveguides 656a to 656f can be easily formed using etching, and the outer wall portions can be omitted. The angles of inclination of the outer surfaces of the waveguides 656a to 656f, which are the inner surfaces of the insulating layer 44, may be the same as the angles of inclination of the outer wall portions 74a to 74f in FIG. 33. If the refractive index of air is less than the refractive index of the insulating layer 44, complete reflection does not occur within the waveguides 656, but the light rays passed, through the apertures 66 are directly reflected by these surfaces, and therefore at least a portion of the light is gathered at the centers of the photoelectric converting elements 42.

Figure 37:
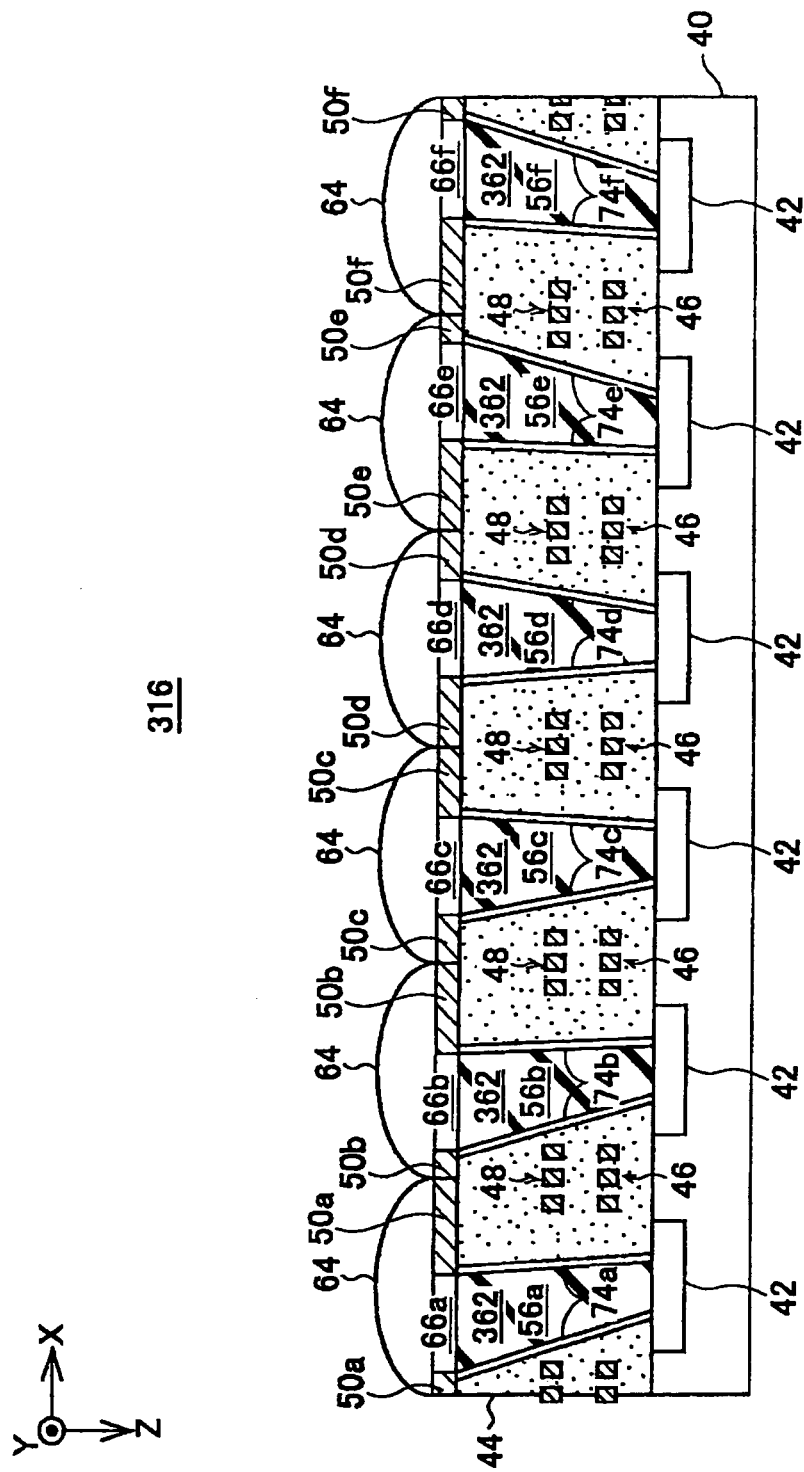
FIG. 37 is a vertical cross-sectional view of an image capturing element in which the inside of the waveguides is formed by color filters with refractive indices greater than that of air.

FIG. 37 is a vertical cross-sectional view of an image capturing element in which the inside of the waveguides is formed by color filters with refractive indices greater than that of air. As shown in FIG. 37, the image capturing element 316 of the present embodiment includes color filters 362 embedded within the waveguides 56a to 56f. As a result, the image capturing element 316 can be made thinner, and the filter performance can be improved. Among the internal portions of the waveguides 56a to 56f, only upper portions near the surfaces are filled with the color filters 362, and the lower portions are hollow, for example. The angles of inclination of the outer wall portions 74a to 74f may be the same as the angles of inclination of the outer wall portions 74a to 74f shown in FIG. 33.

Figure 38:
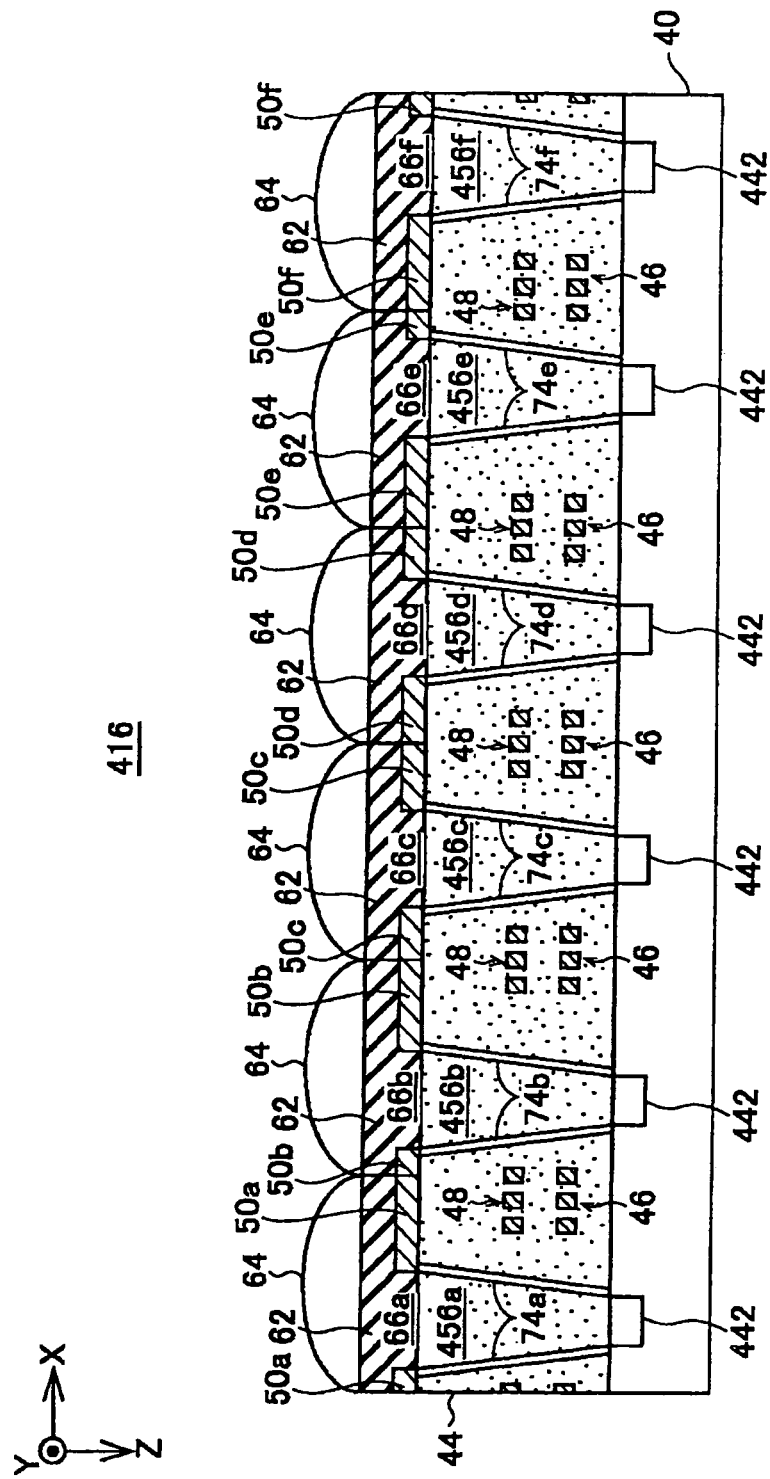
FIG. 38 is a vertical cross-sectional view of an image capturing element in which the shape of the waveguides is changed.

FIG. 38 is a vertical cross-sectional view of an image capturing element in which the shape of the waveguides is changed. As shown in FIG. 38, the image capturing element 416 of the present embodiment includes waveguides 456a to 456f formed parallel to a direction perpendicular to the substrate 40 and the photoelectric converting elements 442. The waveguide 456a may be shaped as a partial vertical frustum, for example. In the image capturing element 416, the intervals between adjacent photoelectric converting elements 442 match the intervals between corresponding apertures 66. As a result, the center of each photoelectric converting element 442 matches the center of the corresponding aperture 66 and waveguide 456. Furthermore, the surface area of the bottom surface of the waveguide 456a is the same as the surface area of the top surface of the corresponding photoelectric converting element 442. In this case, the position and size of each photoelectric converting element 442 may be set to correspond to the position and size of the bottom surface of the corresponding waveguide 456. The angles of inclination of the outer wall portions 74a to 74f of the waveguides 56a to 56f are preferably set such that light rays that pass through the center of the microlenses 64, from among the light passed by the corresponding aperture mask 50a, directly reach the photoelectric converting elements 442 or are reflected once by the outer wall portions 74 to reach the photoelectric converting elements 442.

The above embodiments describe examples of aperture masks in which six types of apertures are formed, but the image capturing element may include aperture masks in which more or less than six types of apertures are formed.

Figure 39:
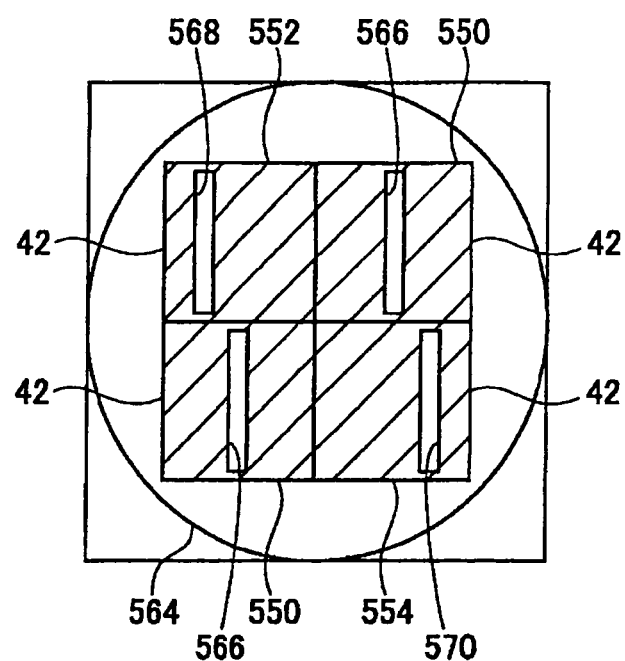
FIG. 39 is a planar view of an enlarged portion of another image capturing element.

FIG. 39 is a planar view of an enlarged portion of another image capturing element. As shown in FIG. 39, one microlens 564 is provided for four aperture masks 550, 552, and 554, in each of which are formed one of four photoelectric converting elements 42 and one of four apertures 566, 568, and 570. As a result, the configuration of the microlens 564 can be simplified. Each photoelectric converting element 42 outputs an electrical signal that is temporally shifted by a switching element such as a transistor. Here, one microlens 564 may correspond to photoelectric converting elements 42 other than the four photoelectric converting elements 42 described above. The waveguides 56a to 56f shown in FIG. 28 are provided to correspond to each of the apertures 566, 568, and 570 in FIG. 39.

In the embodiments shown in FIGS. 28 to 39, when there are a plurality of types of color filters 62 that pass light with different wavelengths, such as red, green, and blue, for each pixel, the angles of inclination of the outer wall portions 74a to 74f of each pixel may be set to fulfill the reflection conditions described above for the corresponding wavelength, with consideration to wavelength scattering of the refractive index. Furthermore, the bottom surfaces of the waveguides are preferably substantially connected to the photoelectric converting elements in the height direction, but there may be a distance therebetween that is no greater than the incident wavelength.

In the manner described above, a large number of repeating patterns 110 can be set by allocating different colors with different periodicity to parallax pixels and non-parallax pixels in a color filter arrangement. The configuration of the waveguides described above can be adopted in an image capturing element utilizing any of the large number of repeating patterns 110. In the above description, a parallax is created in the subject light by providing aperture masks, but wiring can be made to function substantially as the aperture masks by forming the wiring in the wiring layer to have the same shape as the aperture masks. If there are multiple layers of wiring in the wiring layer, the plurality of layers can function together as the aperture masks by forming each layer such that the shape projected by the layer from the direction in which the subject light is incident is the same as the shape of the aperture masks. If the function of the aperture masks is realized by one of the multiple layers of wiring, the bottommost layer of wiring among the multiple layers of wiring, i.e. the wiring that is positioned closest to the photoelectric converting elements, is preferably formed to have the same shape as the aperture masks. In this case, the bottommost layer of wiring is preferably close to the photoelectric converting elements.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

LIST OF REFERENCE NUMERALS 10 digital camera
20 image capturing lens
21 optical axis
30, 31 subject
100 image capturing element
101 microlens
102 color filter
103 aperture mask
104 aperture portion
105 wiring layer
106 wiring
107 aperture
108 photoelectric converting element
109 substrate
110 repeating pattern
120 image capturing element
201 control section
202 A/D conversion circuit
203 memory
204 driving section
205 image processing section
206 computing section
207 memory card IF
208 operation section
109 displaying section
210 LCD drive circuit
220 memory card
16 image capturing element
40 substrate
42 photoelectric converting element
44 insulating layer
46 wiring layer
48 wiring layer
50 aperture mask
56 waveguide
62 color filter
64 microlens
66 aperture
74 outer wall portion
80 groove
116 image capturing element
148 wiring layer
156 waveguide
274 outer wall portion
216 image capturing element
246 wiring layer
256 waveguide
274 outer wall portion
316 image capturing element
362 color filter
416 image capturing element
442 photoelectric converting element
456 waveguide
550 aperture mask
552 aperture mask
554 aperture mask
564 microlens
566 aperture
568 aperture
570 aperture
616 image capturing element
656 waveguide

What is claimed is:

1. A device comprising:
    a photoelectric converting element that converts an incident light into an electric signal;
    an aperture mask coupled with the photoelectric converting element, the aperture mask passing a partial region within a cross-sectional region of the incident light to the photoelectric converting element; and
    an image capturing element including a plurality of photoelectric converting element groups disposed continuously and arranged two-dimensionally in series,
    wherein each photoelectric converting element group includes a plurality of photoelectric converting elements, the aperture masks coupled to the plurality of photoelectric converting elements positioned to respectively pass at least three different partial regions in one dimension of the incident light.

2. The device according to claim 1 further comprising:
    a color filter coupled with the photoelectric converting element, the color filter passing a wavelength band of the incident light to the photoelectric converting element;
    wherein the plurality of photoelectric converting elements of the photoelectric converting element group are coupled with color filters that respectively pass at least two different wavelength bands.

3. The device according to claim 1, wherein the photoelectric converting element group includes at least one photoelectric converting element coupled with an aperture mask that passes an entire region of the incident light.

4. The device according to claim 1, wherein the different partial regions of the aperture masks of the photoelectric converting element group are continuously shifted in a first dimension.

5. The device according to claim 4, wherein the different partial regions of the aperture masks of the photoelectric converting element group are continuously shifted in a second dimension that is perpendicular to the first dimension.

6. The device according to claim 4, wherein the length of the different partial regions in the direction of the first dimension is less than the length of the different partial regions in a direction perpendicular to the first dimension.

7. The device according to claim 4 wherein the different partial regions of the aperture masks are arranged at uniform intervals in the first dimension.

8. The device according to claim 1, further comprising a waveguide that reduces scattering of the incident light passed through the aperture mask and guides the incident light to the photoelectric converting element.

9. The device according to claim 1, wherein one microlens is provided for the photoelectric converting element group.

10. The device according to claim 1, further comprising a lens that guides light to the image capturing element.

11. The device according to claim 1, further comprising an image processing section operable to generate a plurality of images from an image signal output from the image capturing element, wherein each image of the plurality of images includes a portion of the output corresponding to photoelectric converting elements having aperture masks that pass substantially similar partial regions of the incident light.

12. The device according to claim 3, wherein the image capturing element includes an even distribution of photoelectric converting elements having apertures that pass partial regions of the incident light.

13. The device according to claim 3, wherein the image capturing element includes, for every four photoelectric converting elements, at least one photoelectric converting element having an aperture that passes a partial region of the incident light.

14. The device according to claim 2, wherein the photoelectric converting element group includes color filters that respectively pass a red wavelength band, a green wavelength band, and a blue wavelength band.

15. The device according to claim 14, wherein the photoelectric converting element group includes a photoelectric converting element that is not coupled with a color filter.

16. The device according to claim 2, wherein the photoelectric converting element group includes at least one photoelectric converting element coupled with an aperture mask that passes an entire region of the incident light and a color filter that passes one of a blue wavelength band and a red wavelength band, and the plurality of photoelectric converting elements are coupled with color filters that pass a green wavelength band.

17. The device according to claim 16, wherein the photoelectric converting element group includes at least one photoelectric converting element coupled with a color filter that passes a green wavelength band and an aperture mask that passes an entire region of the incident light.

18. The device according to claim 8, wherein the waveguide is inclined.

19. The device according to claim 18, wherein the waveguides are inclined in a manner corresponding to displacement between centers of the apertures of the aperture masks and centers of the photoelectric converting elements.

20. The device according to claim 2, wherein the photoelectric converting element group includes at least one photoelectric converting element including an aperture mask that passes an entire region of the incident light.

21. The device according to claim 2, wherein the photoelectric converting element group includes a second plurality of photoelectric converting elements coupled with different combinations of aperture masks and color filters from a first plurality of photoelectric converting elements of the photoelectric converting element group.

22. The device according to claim 2, wherein the photoelectric converting element group includes a photoelectric converting element that is not coupled with a color filter.

23. The device according to claim 2, wherein the photoelectric converting element group includes a photoelectric converting element coupled with an aperture mask that passes the incident light from the partial regions correspond to photoelectric converting elements on which transparent filters are arranged.

24. The device according to claim 10, further comprising an image processing section operable to generate a plurality of images from an image signal output from the image capturing element, each image of the plurality of images generated as a combination of the output corresponding to photoelectric converting elements having aperture masks that pass substantially similar partial regions of the incident light, while maintaining a positional relationship of the output with respect to the image capturing element.

25. A device comprising:
a plurality of photoelectric converting elements disposed continuously and arranged two-dimensionally in series on an image capturing element, each photoelectric converting element operable to convert an incident light into an electric signal and including an aperture mask, the aperture masks positioned to respectively pass at least three different partial regions in one dimension of the incident light.

26. The device of claim 25, wherein each photoelectric converting element includes a color filter, each color filter respectively passes one of at least two different wavelength bands of the incident light to the photoelectric converting element.

27. The device of claim 25, further comprising a lens that guides light to the image capturing element.

28. The device according to claim 25, further comprising an image processing section operable to generate a plurality of images from an image signal output from the image capturing element, each image of the plurality of images generated as a combination of the output corresponding to photoelectric converting elements having aperture masks that pass substantially similar partial regions of the incident light, while maintaining a positional relationship of the output with respect to the image capturing element.

29. A device comprising:
a first photoelectric converting element that converts an incident light into a first electric signal;
a first aperture mask coupled with the first photoelectric converting element that passes a first partial region within a cross-sectional region of the incident light to the first photoelectric converting element;
a second photoelectric converting element electrically connected to the first photoelectric converting element that converts the incident light into a second electrical signal;
a second aperture mask coupled with the second photoelectric converting element that passes a second partial region within a cross-sectional region of the incident light to the second photoelectric converting element;
an image capturing element including a plurality of photoelectric converting element groups disposed continuously and arranged two-dimensionally in series, each photoelectric converting element group including the first and second photoelectric converting elements and the first and second aperture masks; and
an image processing section operable to generate a plurality of images from an image signal output from the image capturing element, each image of the plurality of images generated as a combination of the output corresponding to photoelectric converting elements having aperture masks that pass substantially similar partial regions of the incident light, while maintaining a positional relationship of the output with respect to the image capturing element.

30. The device of claim 29, further comprising:
a third photoelectric converting element electrically connected to the first photoelectric converting element that converts the incident light into a third electric signal; and a third aperture mask coupled with the third photoelectric converting element that passes an entire region of the incident light to the third photoelectric converting element, wherein each photoelectric converting element group further includes the third photoelectric converting element and the third aperture mask.

31. The device of claim 29, wherein the first partial region is symmetrical to the second partial region in a first dimension.

32. The device of claim 29, further comprising:
a first color filter coupled with the first photoelectric converting element that passes a first wavelength band of the incident light to the first photoelectric converting element; and
a second color filter coupled with the second photoelectric converting element that passes a second wavelength band of the incident light to the second photoelectric converting element,
wherein each photoelectric converting element group further includes the first and second color filters.

33. The device of claim 29, further comprising a lens that guides light to the image capturing element; and
an image processing section to generate a plurality of images from an image signal output from the image capturing element.

34. The device of claim 31, further comprising:
a fourth photoelectric converting element electrically connected to the first photoelectric converting element that converts the incident light into a fourth electric signal; and,
a fourth aperture mask coupled with the fourth photoelectric converting element that passes a fourth partial region within a cross-sectional region of the incident light to the fourth photoelectric converting element;
a fifth photoelectric converting element electrically connected to the first photoelectric converting element that converts the incident light into a fifth electric signal; and,
a fifth aperture mask coupled with the fifth photoelectric converting element that passes a fifth partial region within a cross-sectional region of the incident light to the fifth photoelectric converting element,
wherein each photoelectric converting element group further includes the fourth and fifth photoelectric converting elements and the fourth and fifth aperture masks.

35. The device of claim 34, wherein the fourth partial region is symmetrical to the fifth partial region in the first dimension.

36. The device of claim 35, wherein the first, second, fourth, and fifth partial regions are arranged at uniform intervals across the first dimension.

37. The device of claim 34, wherein the fourth partial region is symmetrical to the first partial region in a second dimension that is perpendicular to the first dimension, and the fifth partial region is symmetrical to the second partial region in the second dimension.

38. The device of claim 32, further comprising:
a fourth photoelectric converting element electrically connected to the first photoelectric converting element that converts the incident light into a fourth electric signal;
a fourth aperture mask coupled with the fourth photoelectric converting element that passes a fourth partial region within a cross-sectional region of the incident light to the fourth photoelectric converting element;

a fourth color filter coupled with the fourth photoelectric converting element that passes a fourth wavelength band of the incident light to the fourth photoelectric converting element;
a fifth photoelectric converting element electrically connected to the first photoelectric converting element that converts the incident light into a fifth electric signal;
a fifth aperture mask coupled with the fifth photoelectric converting element that passes a fifth partial region within a cross-sectional region of the incident light to the fifth photoelectric converting element; and
a fifth color filter coupled with the fifth photoelectric converting element that passes a fifth wavelength band of the incident light to the fifth photoelectric converting element,
wherein each photoelectric converting element group further includes the fourth and fifth photoelectric converting elements, the fourth and fifth aperture masks, and the fourth and fifth color filters.

39. The device of claim 38, wherein the first wavelength band is a blue wavelength band, the second and the fourth wavelength bands are green wavelength bands, and the fifth wavelength band is a red wavelength band.

40. The device of claim 38, wherein the first wavelength band is a transparent wavelength band, the second wavelength band is a blue wavelength band, the fourth wavelength band is a green wavelength band, and the fifth wavelength band is a red wavelength band.

41. The device of claim 32, further comprising:
a third photoelectric converting element electrically connected to the first photoelectric converting element that converts the incident light into a third electric signal; and,
a third aperture mask coupled with the third photoelectric converting element that passes an entire region of the incident light to the third photoelectric converting element,
wherein each photoelectric converting element group further includes the third photoelectric converting element and the third aperture mask.

42. A device comprising:
a plurality of photoelectric converting element groups disposed continuously and arranged two-dimensionally in series, each photoelectric converting element group comprising:
at least one left-parallax photoelectric converting element coupled with a left-parallax aperture mask and a first color filter, the left-parallax aperture mask passing a left partial region within a cross-sectional region of an incident light to the left-parallax photoelectric converting element, the first color filter passing a first wavelength band of the incident light to the left-parallax photoelectric converting element,
at least one right-parallax photoelectric converting element coupled with a right-parallax aperture mask and a second color filter, the right-parallax aperture mask passing a right partial region within a cross-sectional region of the incident light to the right-parallax photoelectric converting element, the second color filter passing a second wavelength band of the incident light to the right-parallax photoelectric converting element, and
at least one non-parallax photoelectric converting element coupled with a non-parallax aperture mask, the non-parallax aperture mask passing an entire region of the incident light to the non-parallax photoelectric converting element; and an image processing section operable to generate a plurality of images from an image signal output from the plurality of photoelectric converting element groups, each image of the plurality of images generated as a combination of the output corresponding to photoelectric converting elements having aperture masks that pass substantially similar partial regions of the incident light, while maintaining a positional relationship of the output with respect to the image capturing element.

* * * * *